(12) United States Patent
Kim et al.

(10) Patent No.: US 12,476,184 B2
(45) Date of Patent: Nov. 18, 2025

(54) SEMICONDUCTOR DEVICE AND METHOD OF FABRICATING THE SAME

(71) Applicant: SAMSUNG ELECTRONICS CO., LTD., Suwon-si (KR)

(72) Inventors: John Soo Kim, Hwaseong-si (KR); Min Wook Chung, Suwon-si (KR); Kyoung Suk Kim, Seongnam-si (KR); Soo Kyung Kim, Daegu (KR); Won Suk Lee, Hwaseong-si (KR); Jong Jin Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 592 days.

(21) Appl. No.: 17/845,209

(22) Filed: Jun. 21, 2022

(65) Prior Publication Data
US 2023/0197604 A1 Jun. 22, 2023

(30) Foreign Application Priority Data
Dec. 17, 2021 (KR) .................. 10-2021-0181491

(51) Int. Cl.
*H01L 23/522* (2006.01)
*H01L 21/768* (2006.01)
*H01L 23/532* (2006.01)

(52) U.S. Cl.
CPC .... *H01L 23/5226* (2013.01); *H01L 21/76802* (2013.01); *H01L 21/7682* (2013.01);
(Continued)

(58) Field of Classification Search
CPC ........... H01L 23/5226; H01L 23/53238; H01L 21/76802; H01L 21/7682; H01L 21/76843
See application file for complete search history.

(56) References Cited

U.S. PATENT DOCUMENTS 7,414,314 B2    8/2008  Abe
8,841,769 B2 *  9/2014  Park ................. H01L 21/76832
                                                      438/653
(Continued)

FOREIGN PATENT DOCUMENTS

CN    102651358 A  *  8/2012  ......... H01L 21/3212
JP    2007-188911 A     7/2007
(Continued)

OTHER PUBLICATIONS

Communication issued Aug. 25, 2025 by the Korean Intellectual Property Office in counterpart Korean Patent Application No. 10-2021-0181491.

*Primary Examiner* — Joshua Benitez Rosario
*Assistant Examiner* — Jacob T Nelson
(74) *Attorney, Agent, or Firm* — Sughrue Mion, PLLC

(57) ABSTRACT

A semiconductor device is provided. The semiconductor device includes: a first interlayer insulating film defining a lower wiring trench; a lower wiring structure including a first lower barrier film which extends along sidewalls of the lower wiring trench, and a lower filling film which is on the first lower barrier film; a second interlayer insulating film on the first interlayer insulating film, the second interlayer insulating film defining an upper wiring trench which exposes at least part of the lower wiring structure; and an upper wiring structure provided in the upper wiring trench and connected to the lower wiring structure. An upper surface of the first lower barrier film is closer to a bottom surface of the lower wiring trench than each of an upper surface of the first interlayer insulating film and an upper surface the lower filling film. The upper surface of the first lower barrier film is concave.

19 Claims, 29 Drawing Sheets

(52) U.S. Cl.
CPC .. *H01L 21/76846* (2013.01); *H01L 21/76877* (2013.01); *H01L 23/53238* (2013.01); *H01L 23/5329* (2013.01)

(56) References Cited

U.S. PATENT DOCUMENTS

| | | | |
|---|---|---|---|
| 9,093,455 | B2 | 7/2015 | Liou et al. |
| 2004/0004287 | A1* | 1/2004 | Shimizu ............ H01L 21/76843 257/E23.161 |
| 2017/0110569 | A1* | 4/2017 | Chang ............... H01L 21/76895 |
| 2020/0105664 | A1* | 4/2020 | Han .................... H01L 23/5226 |
| 2021/0090999 | A1 | 3/2021 | Yoo et al. |

FOREIGN PATENT DOCUMENTS

| | | |
|---|---|---|
| KR | 10-2008-0091990 A | 10/2008 |
| KR | 10-2014-0023763 A | 2/2014 |
| KR | 10-2017-0073627 A | 6/2017 |
| KR | 10-2018-0134037 A | 12/2018 |
| KR | 10-2021-0077064 A | 6/2021 |

* cited by examiner

SEMICONDUCTOR DEVICE AND METHOD OF FABRICATING THE SAME

CROSS-REFERENCE TO RELATED APPLICATION

This application claims priority from Korean Patent Application No. 10-2021-0181491, filed on Dec. 17, 2021, in the Korean Intellectual Property Office, the disclosure of which is incorporated herein by reference in its entirety.

BACKGROUND

1. Field

The present disclosure relates to a semiconductor device and a method of fabricating the same, and more particularly, to a semiconductor device including wiring lines formed during a back-end-of-line (BEOL) process and a method of fabricating the semiconductor device.

2. Description of Related Art

Due to developments in electronic technology and the recent trend of down-scaling, increased integration density and reduced power consumption are required of semiconductor chips. In order to meet these requirements, the feature size of semiconductor devices has continuously decreased.

As the feature size of semiconductor devices has decreased, various research has been conducted on ways to stably connect wires.

SUMMARY

Aspects of the present disclosure provide a semiconductor device capable of improving device performance and reliability.

Aspects of the present disclosure also provide a method of fabricating a semiconductor device capable of improving device performance and reliability.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of an example embodiment, a semiconductor device includes: a first interlayer insulating film defining a lower wiring trench; a lower wiring structure including a first lower barrier film which extends along sidewalls of the lower wiring trench, and a lower filling film which is on the first lower barrier film; a second interlayer insulating film on the first interlayer insulating film, the second interlayer insulating film defining an upper wiring trench which exposes at least part of the lower wiring structure; and an upper wiring structure provided in the upper wiring trench and connected to the lower wiring structure. An upper surface of the first lower barrier film is closer to a bottom surface of the lower wiring trench than each of an upper surface of the first interlayer insulating film and an upper surface the lower filling film. The upper surface of the first lower barrier film is concave.

According to an aspect of an example embodiment, a semiconductor device includes: a first interlayer insulating film defining a lower wiring trench; a lower wiring structure including a first lower barrier film which extends along sidewalls of the lower wiring trench, a lower filling film which is on the first lower barrier film, a second lower barrier film which is between the first lower barrier film and the lower filling film and extends along the sidewalls of the lower wiring trench, and a lower capping film which extends along an upper surface of the lower filling film and includes side surfaces which face the second lower barrier film; a second interlayer insulating film on the first interlayer insulating film, the second interlayer insulating film defining an upper wiring trench which exposes at least part of the lower wiring structure; an etch stopper film extending along an upper surface of the first interlayer insulating film, between the first interlayer insulating film and the second interlayer insulating film; and an upper wiring structure including an upper barrier film which extends along sidewalls of the upper wiring trench, and an upper filling film which is on the upper barrier film. An upper surface of the first lower barrier film is closer to a bottom surface of the lower wiring trench than each of the upper surface of the second lower barrier film and the upper surface of the lower filling film.

According to an aspect of an example embodiment, a semiconductor device includes: a first interlayer insulating film defining a lower wiring trench; a lower wiring structure including a first lower barrier film which extends along sidewalls of the lower wiring trench, a lower filling film which is on the first lower barrier film, and a second lower barrier film which is between the first lower barrier film and the lower filling film and extends along the sidewalls of the lower wiring trench; a second interlayer insulating film on the first interlayer insulating film, the second interlayer insulating film defining an upper wiring trench which exposes at least part of the lower wiring structure; an etch stopper film extending between the first interlayer insulating film and the second interlayer insulating film; and an upper wiring structure including an upper barrier film which extends along sidewalls of the upper wiring trench, and an upper filling film which is on the upper barrier film. An upper surface of the first lower barrier film is closer to a bottom surface of the lower wiring trench than each of an upper surface of the second lower barrier film and an upper surface of the lower filling film. The first lower barrier film includes any one or any combination of ruthenium (Ru), molybdenum (Mo), and titanium (Ti). The second lower barrier film includes any one or any combination of tantalum (Ta), tantalum nitride (TaN), and cobalt (Co). The lower filling film includes copper (Cu).

BRIEF DESCRIPTION OF THE DRAWINGS

The above and other aspects will be more apparent from the following description of example embodiments taking in conjunction with the attached drawings, in which.

DETAILED DESCRIPTION

Embodiments will now be described with reference to the accompanying drawings. Embodiments described herein are example embodiments, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

The accompanying drawings illustrate a fin field-effect transistor (FinFET) including a fin pattern-shape channel region, a transistor including nanowires or nanosheets, a Multi-Bridge Channel field-effect transistor (MBCFET™), and a vertical field-effect transistor (FET) as example semiconductor devices, but embodiments are not limited thereto. Semiconductor devices according to some embodiments may also include a tunneling FET and a three-dimensional (3D) transistor. The semiconductor devices according to some embodiments may also include a planar transistor. The technical concept may be applicable to a two-dimensional (2D) material-based FET and a heterostructure thereof.

The semiconductor devices according to some embodiments may also include a bipolar junction transistor and a laterally-diffused metal-oxide semiconductor (LDMOS).

Figure 1:
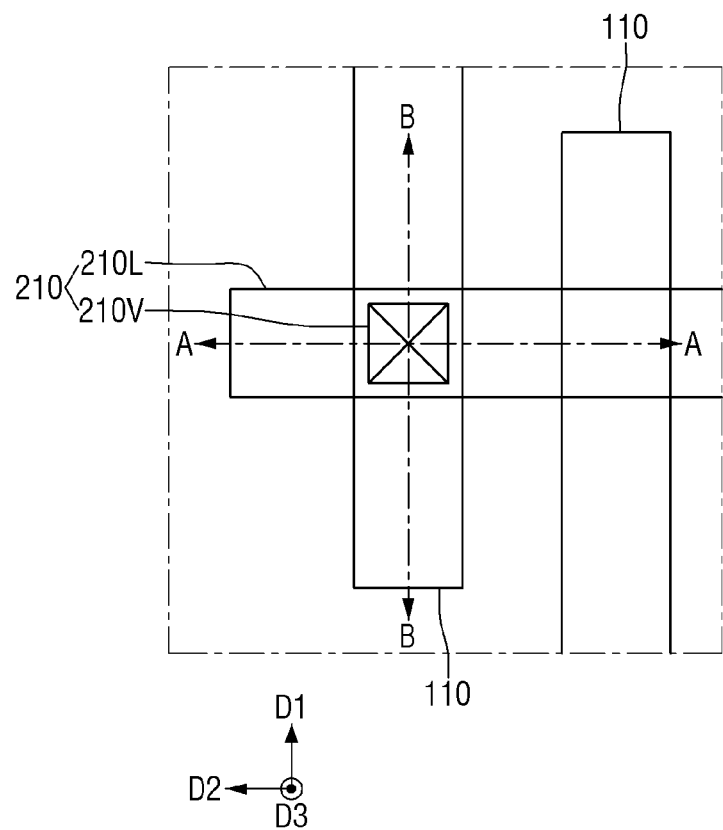
FIG. 1 is a layout view of a semiconductor device according to some embodiments.
Figure 2:
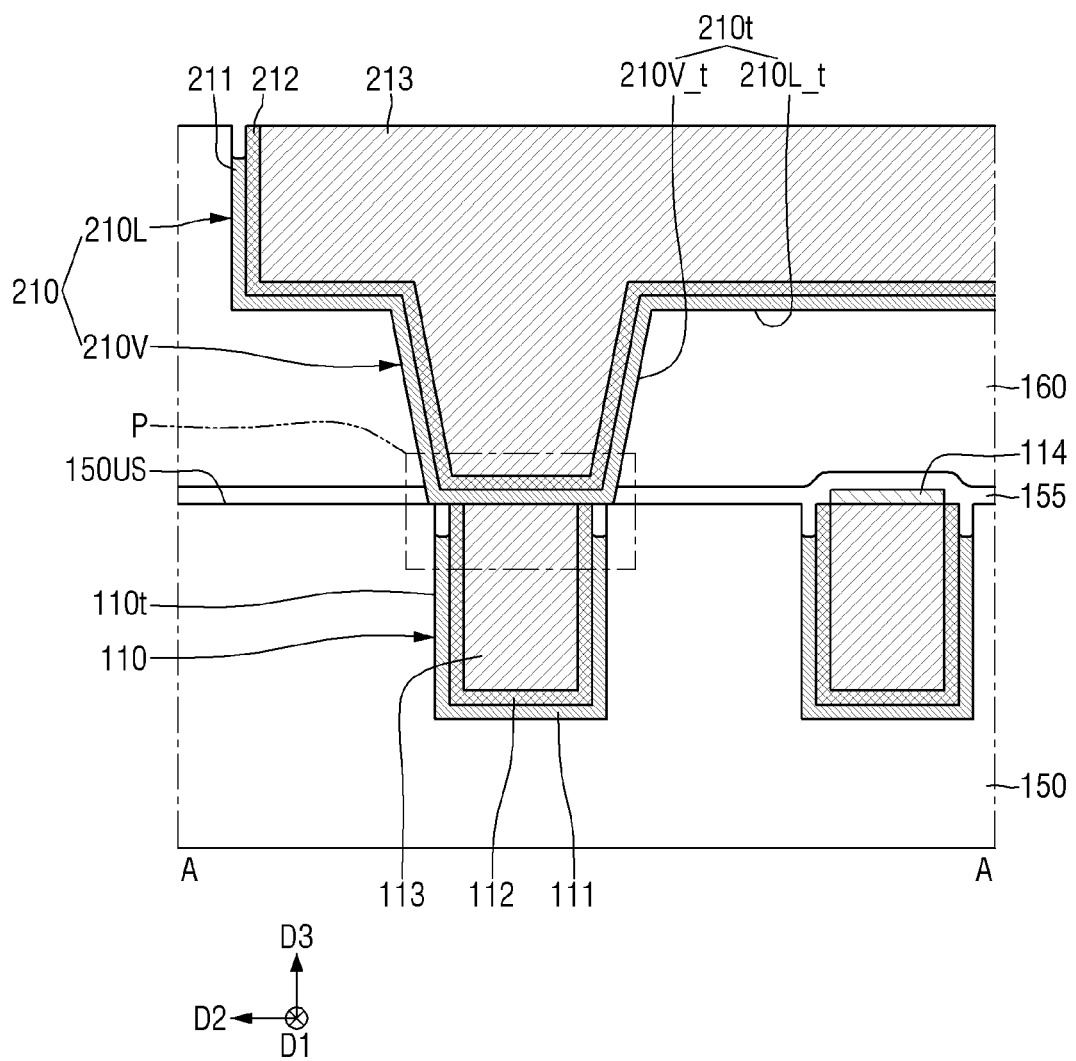
FIG. 2 is a cross-sectional view taken along line A-A of FIG. 1.
Figure 3:
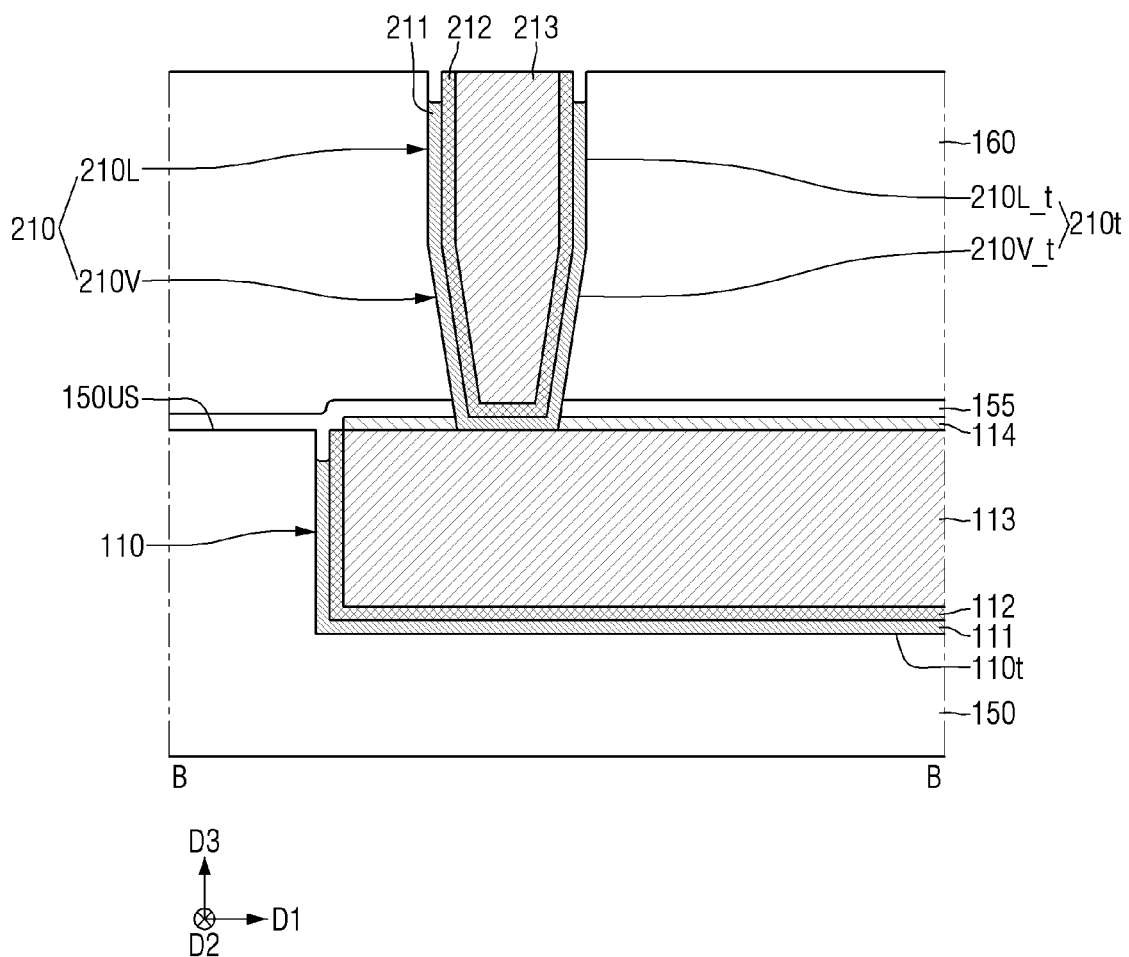
FIG. 3 is a cross-sectional view taken along line B-B of FIG. 1.
Figure 4:
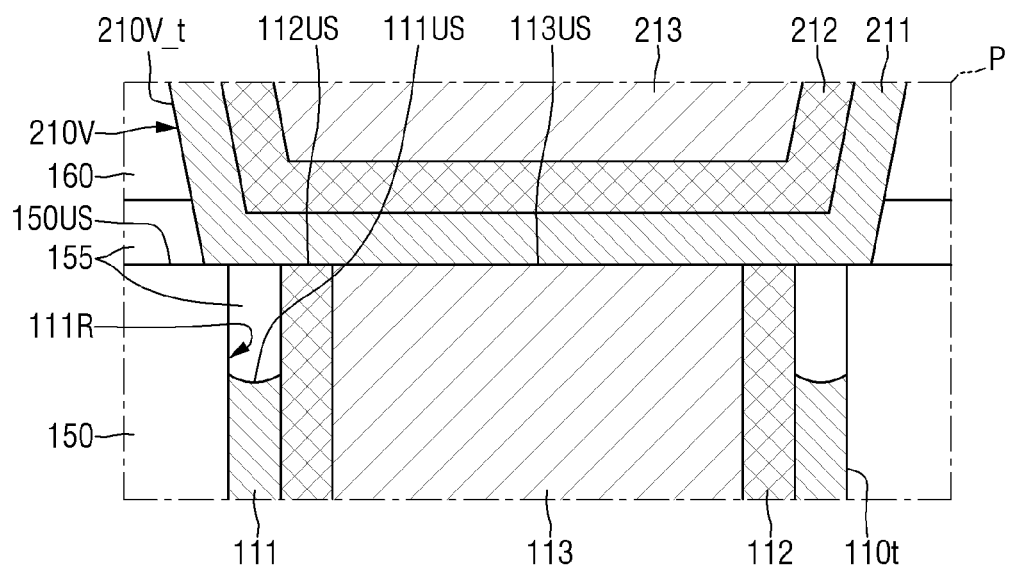
FIGS. 4 through 6 are enlarged cross-sectional views of part P of FIG. 2.
Figure 5:
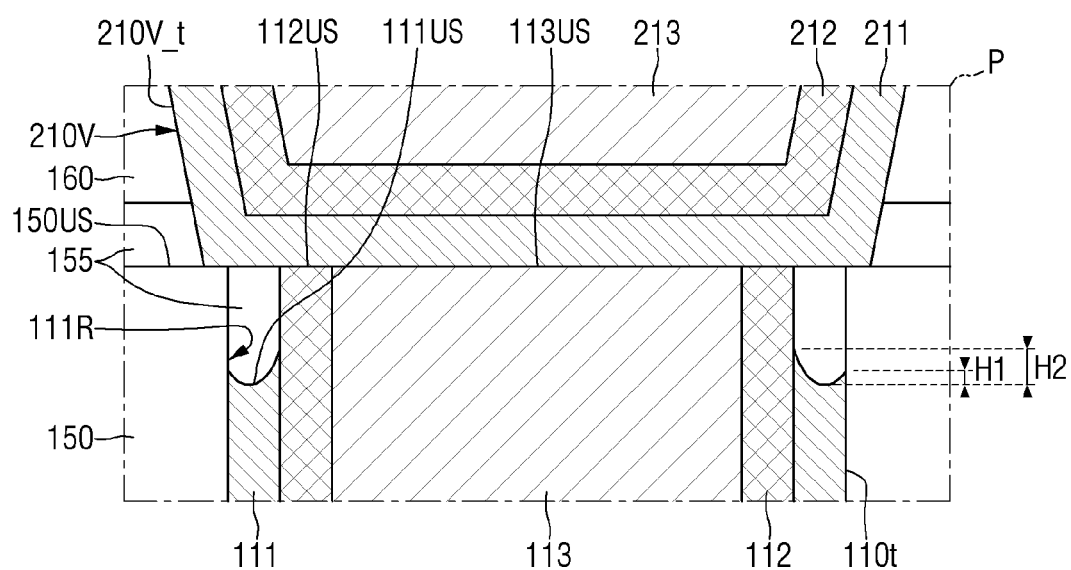
Figure 6:
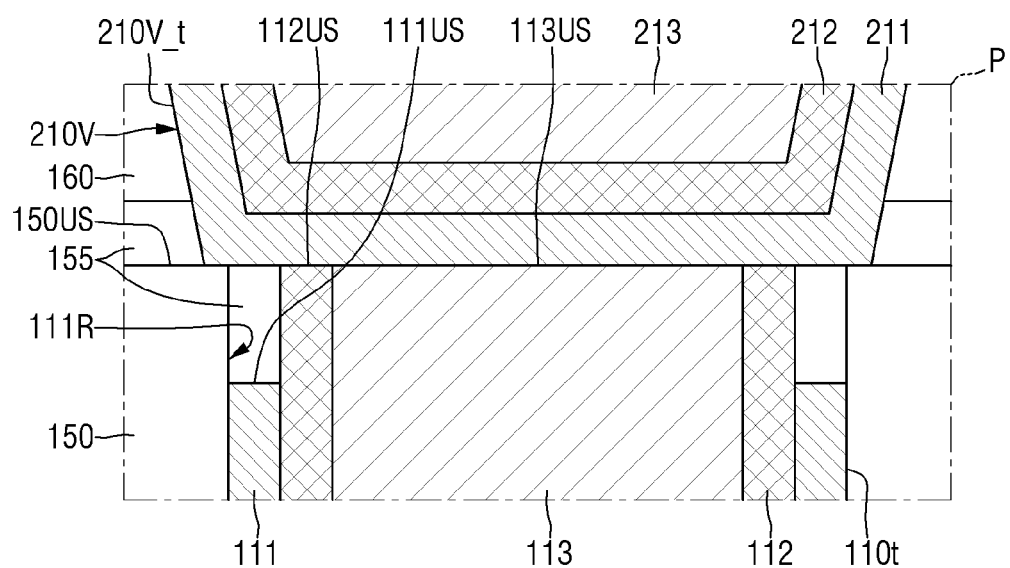

FIG. 1 is a layout view of a semiconductor device according to some embodiments. FIG. 2 is a cross-sectional view taken along line A-A of FIG. 1. FIG. 3 is a cross-sectional view taken along line B-B of FIG. 1. FIGS. 4 through 6 are enlarged cross-sectional views of part P of FIG. 2.

Referring to FIGS. 1 through 5, the semiconductor device according to some embodiments may include a lower wiring structure 110 and an upper wiring structure 210.

The lower wiring structure 110 may be disposed in a first interlayer insulating film 150. The lower wiring structure 110 may extend in a first direction D1.

The lower wiring structure 110 may have a linear shape extending in the first direction D1. For example, the first direction D1 may be the lengthwise direction of the lower wiring structure 110, and a second direction D2 may be the widthwise direction of the lower wiring structure 110. Here, the first direction D1 may intersect the second direction D2 and a third direction D3, and the second direction D2 may intersect the third direction D3. The third direction D3 may be perpendicular to the first direction D1 and the second direction D2.

For example, the first interlayer insulating film 150 may be provided on, and for example may cover, the gate electrode and source/drain of a transistor formed by a front-end-of-line (FEOL) process. As another example, the first interlayer insulating film 150 may be an interlayer insulating film obtained by a back-end-of-line (BEOL) process.

In this regard, the lower wiring structure 110 may be a contact or contact wiring formed by a middle-of-line (MOL) process, or the lower wiring structures 110 may be connecting wiring formed by a BEOL process. The lower wiring structure 110 will hereinafter be described as being connecting wiring obtained by a BEOL process.

The first interlayer insulating film 150 may include at least one of, for example, silicon oxide, silicon nitride, silicon oxynitride, and a low-k material. The low-k material may be, for example, silicon oxide with a relatively high carbon and hydrogen content, such as SiCOH. By providing carbon (C) in the low-k material, the dielectric constant may be lowered. To further lower the dielectric constant, the first interlayer insulating film 150 may include pores such as cavities filled with a gas or the air.

The low-k material may include, for example, fluorinated tetraethylorthosilicate (FTEOS), hydrogen silsesquioxane (HSQ), bis-benzocyclobutene (BCB), tetramethyl orthosilicate (TMOS), octamethylcyclotetrasiloxane (OMCTS), hexamethyldisiloxane (HMDSO), trimethylsilyl borate (TMSB), diacetoxyditertiarybutosiloxane (DADBS), trimethylsilyl phosphate (TMSP), polytetrafluoroethylene (PTFE), tonen silazen (TOSZ), fluoride silicate glass (FSG), polyimide nanofoams (e.g., polypropylene oxide), carbon-doped silicon oxide (CDO), organo silicate glass (OSG), SiLK, amorphous fluorinated carbon, silica aerogels, silica xerogels, mesoporous silica, or a combination thereof, but embodiments are not limited thereto.

The lower wiring structure 110 may be disposed in a first metal level. The first interlayer insulating film 150 may include a lower wiring trench 110t, which extends in the first direction D1.

The lower wiring structure 110 may be disposed in the lower wiring trench 110t. The lower wiring structure 110 may be provided in the lower wiring trench 110t.

The lower wiring structure 110 may include a first lower barrier film 111, a second lower barrier film 112, a lower filling film 113, and a lower capping film 114. The second lower barrier film 112 may be disposed between the first lower barrier film 111 and the lower filling film 113. The lower capping film 114 may be disposed on the lower filling film 113.

The first lower barrier film 111 may extend along the sidewalls and the bottom surface of the lower wiring trench 110t. The first lower barrier film 111 may be in contact with the first interlayer insulating film 150.

The second lower barrier film 112 may be disposed on the first lower barrier film 111. The second lower barrier film 112 may extend along the sidewalls and the bottom surface of the lower wiring trench 110t, on the first lower barrier film 111. The second lower barrier film 112 may be in contact with the first lower barrier film 111.

The lower filling film 113 may be disposed on the second lower barrier film 112. For example, the lower filling film 113 may fill the rest of the lower wiring trench 110t.

The lower capping film 114 may extend along an upper surface 113US of the lower filling film 113. The lower capping film 114 is not disposed on upper surfaces 111US and 112US of the first and second lower barrier films 111 and 112. The lower capping film 114 does not cover the upper surfaces 111US and 112US of the first and second lower barrier films 111 and 112. The lower capping film 114 may be separated from the upper surfaces 111US and 112US of the first and second lower barrier films 111 and 112.

For example, the upper surface 111US of the first lower barrier film 111 may be lower than the upper surface 112US of the second lower barrier film 112 based on the bottom surface of the lower wiring trench 110t. Also, the upper surface 111US of the first lower barrier film 111 may be lower than the upper surface 113US of the lower filling film 113. The upper surface 111US of the first lower barrier film 111 may be lower than a upper surface 150US of the first interlayer insulating film 150.

The upper surface 111US of the first lower barrier film 111 may be a part of the first lower barrier film 111 which extends along the sidewalls of the lower wiring trench 110t. The upper surface 111US of the first lower barrier film 111 may refer to the uppermost surface of the part of the first lower barrier film 111 extending along the sidewalls of the lower wiring trench 110t.

A lower barrier film recess 111R may be defined on the upper surface 111US of the first lower barrier film 111 between the first interlayer insulating film 150 and the lower filling layer 113. Specifically, the lower barrier film recess 111R may be defined on the upper surface 111US of the first lower barrier film 111 between the first interlayer insulating film 150 and the second lower barrier film 112.

The bottom surface of the lower barrier film recess 111R may correspond to the upper surface 111US of the first lower barrier film 111. The sidewalls of the lower barrier film recess 111R may correspond to the first interlayer insulating film 150 and the second lower barrier film 112.

As the lower barrier film recess 111R is defined between the first interlayer insulating film 150 and the second lower barrier film 112, the shortest distance between the lower wiring structure 110 and an upper via 210V may increase. When the upper wiring structure 210 is connected to one of a pair of adjacent lower wiring structures 110 in the second direction D2, a short circuit between the upper wiring structure and the other lower wiring structure 110 can be prevented due to the increased shortest distance.

The upper surface 112US of the second lower barrier film 112 may be provided on the same plane as the upper surface 113US of the lower filling film 113. The upper surface 112US of the second lower barrier film 112 and the upper surface 113US of the lower filling film 113 may both be flat.

Referring to FIGS. 4 and 5, the upper surface 111US of the first lower barrier film 111 may include a concave surface. For example, the upper surface 111US of the first lower barrier film 111 may be concave.

Referring to FIG. 5, the height of a location where the upper surface 111US of the first lower barrier film 111 meets the first interlayer insulating film 150 may be a first height H1, and the height of a location where the upper surface 111US of the first lower barrier film 111 meets the second lower barrier film 112 may be a second height H2. For example, the second height H2 may be greater than the first height H1. The first and second heights H1 and H2 may be measured from the lowermost point on the upper surface 111US of the first lower barrier film 111.

Referring to FIG. 6, the upper surface 111US of the first lower barrier film 111 may be flat.

The upper surface 111US of the first lower barrier film 111 will hereinafter be described as including a concave surface, as illustrated in FIG. 4.

The first lower barrier film 111 may include a conductive material such as, for example, a metal. The first lower barrier film 111 may include at least one of, for example, ruthenium (Ru), molybdenum (Mo), and titanium (Ti).

The second lower barrier film 112 may include a conductive material. For example, the second lower barrier film 112 may include at least one of, for example, tantalum (Ta), cobalt (Co), tantalum nitride (TaN), titanium nitride (TiN), tungsten nitride (WN), zirconium nitride (ZrN), vanadium nitride (VN), and niobium nitride (NbN). The second lower barrier film 112 will hereinafter be described as including at least one of Ta, Co, and TaN.

The lower filling film 113 may include a conductive material. For example, the lower filling film 113 may include at least one of, for example, aluminum (Al), copper (Cu), tungsten (W), cobalt (Co), Ru, silver (Ag), gold (Au), manganese (Mn), Mo, rhodium (Rh), iridium (Ir), RuAl, NiAl, NbB$_2$, MoB$_2$, TaB$_2$, V$_2$AlC, and CrAlC. Specifically, the lower filling layer 113 may include Cu.

The lower capping film 114 may include a conductive material such as, for example, a metal. The lower capping film 114 may include at least one of, for example, Co, Ru, and Mn. Specifically, the lower capping film 114 may include Co. The lower capping film 114 may be formed of Co.

Additionally, a via pattern connecting conductive patterns below the lower wiring structure 110 may be further provided.

The lower wiring structure 110 may be formed by, for example, a damascene process. FIG. 2 illustrates that the lower wiring structure 110 has a uniform width in the second direction D2, but embodiments are not limited thereto. For example, the width, in the second direction D2, of the lower wiring structure 110 may decrease away from the upper surface 150US of the first interlayer insulating film 150.

A first etch stopper film 155 may be disposed on the lower wiring structure 110 and the first interlayer insulating film 150. A second interlayer insulating film 160 may be disposed on the first etch stopper film 155. The first etch stopper film 155 may be disposed between the first and second interlayer insulating films 150 and 160.

The first etch stopper film 155 may extend into the lower barrier film recess 111R. For example, the first etch stopper film 155 may fill the entire lower barrier film recess 111R. The first etch stopper film 155 may be in contact with the upper surface 111US of the first lower barrier film 111.

The second interlayer insulating film 160 may include an upper wiring trench 210t. The upper wiring trench 210t may penetrate the first etch stopper film 155. The upper wiring trench 210t may expose part of the lower wiring structure 110.

The upper wiring trench 210t may include an upper via trench 210V_t and an upper wiring line trench 210L_t. The upper wiring line trench 210L_t may extend in the second direction D2. The upper wiring line trench 210L_t may extend to the upper surface of the second interlayer insulating film 160. The upper via trench 210V_t may be formed at the bottom surface of the upper wiring line trench 210L_t and extend to the third direction D3 to the upper wiring line trench 210L_t.

For example, the bottom surface of the upper wiring trench 210t may correspond to the bottom surface of the upper via trench 210V_t. At least part of the bottom surface of the upper wiring trench 210t may be defined by the lower wiring structure 110.

The sidewalls of the upper wiring trench 210t may include the sidewalls of the upper wiring line trench 210L_t, and the sidewalls of the upper via trench 210V_t. The sidewalls and the bottom surface of the upper wiring line trench 210L_t may be defined by the second interlayer insulating film 160. The sidewalls of the upper via trench 210V_t may be defined by the second interlayer insulating film 160 and the first etch stopper film 155.

The upper wiring trench 210t may penetrate the lower capping film 114. The upper wiring trench 210t may expose part of the upper surface 113US of the lower filling film 113.

Parts of the sidewalls of the upper via trench 210V_t may be defined by the lower capping film 114. At least part of the bottom surface of the upper wiring trench 210t may be defined by the upper surface 113US of the lower filling film 113.

The second interlayer insulating film 160 may include at least one of, for example, silicon oxide, silicon nitride, silicon oxynitride, and the low-k material.

The first etch stopper film 155 may include a material having etching selectivity with respect to the second interlayer insulating film 160. The first etch stopper film 155 may include at least one of, for example, silicon nitride (SiN), silicon oxynitride (SiON), silicon oxycarbonitride (SiOCN), silicon boron nitride (SiBN), silicon oxyboron nitride (SiOBN), silicon oxycarbide (SiOC), aluminum oxide (AlO), aluminum nitride (AlN), aluminum oxycarbide (AlOC), and a combination thereof.

Although the first etch stopper film 155 is illustrated as a single-layer film, embodiments are not limited thereto. For example, the first etch stopper film 155 may include a plurality of insulating films that are sequentially stacked on the first interlayer insulating film 150.

The upper wiring structure 210 may be disposed in the upper wiring trench 210t. The upper wiring structure 210 may fill the upper wiring trench 210t. The upper wiring structure 210 may be disposed in the second interlayer insulating film 160.

The upper wiring structure 210 may be disposed on the lower wiring structure 110. The upper wiring structure 210 may be connected to the lower wiring structure 110. The upper wiring structure 210 may be in contact with the lower wiring structure 110.

The upper wiring structure 210 may include an upper wiring line 210L and an upper via 210V. The upper via 210V may connect the upper wiring line 210L and the lower wiring structure 110. The upper via 210V may be in contact with the lower wiring structure 110.

The upper wiring structure 210 may be in contact with the upper surface 113US of the lower filling film 113. The upper via 210V may be in contact with the upper surface 113US of the lower filling film 113.

The width, in the second direction D2, of the bottom surface of the upper via 210V may be greater than the width, in the second direction D2, of the upper surface of the lower wiring structure 110. Alternatively, the width, in the second direction D2, of the bottom surface of the upper via 210V may be substantially the same as the width, in the second direction D2, of the upper surface of the lower wiring structure 110. Alternatively, the width, in the second direction D2, of the bottom surface of the upper via 210V may be less than the width, in the second direction D2, of the upper surface of the lower wiring structure 110.

The upper wiring structure 210 may be provided in the upper via trench 210V_t and the upper wiring line trench 210L_t. The upper wiring line 210L may be disposed in the upper wiring line trench 210L_t. The upper via 210V may be disposed in the upper via trench 210V_t.

The upper wiring line 210L may be disposed in a second metal level, which is different from the first metal level. The upper wiring line 210L may be disposed in the second metal level, which is higher than the first metal level.

The upper wiring structure 210 may include a first upper barrier film 211, a second upper barrier film 212, and an upper filling film 213. The second upper barrier film 212 may be disposed between the first upper barrier film 211 and the upper filling film 213. Additionally, the upper wiring structure 210 may include an upper capping film, which corresponds to the lower capping film 114.

In the semiconductor device according to some embodiments, the number of barrier films included in the upper wiring structure 210 may be the same as the number of barrier films included in the lower wiring structure 110.

The first upper barrier film 211 may extend along the sidewalls and the bottom surface of the upper wiring trench 210t. The first upper barrier film 211 may extend along the sidewalls and the bottom surface of the upper wiring line trench 210L_t, and the sidewalls and the bottom surface of the upper via trench 210V_t.

The first upper barrier film 211 may be in contact with the second interlayer insulating film 160. For example, the first upper barrier film 211 may be in contact with the upper surface 113US of the lower filling film 113.

The second upper barrier film 212 may be disposed on the first upper barrier film 211. The second upper barrier film 212 may extend along the sidewalls and the bottom surface of the upper wiring trench 210t, on the first upper barrier film 211. The second upper barrier film 212 may extend along the sidewalls and the bottom surface of the upper wiring line trench 210L_t, and the sidewalls and the bottom surface of the upper via trench 210V_t. The second upper barrier film 212 may be in contact with the first upper barrier film 111.

The upper filling film 213 may be disposed on the first and second upper barrier films 211 and 212. The upper filling film 213 may be in contact with the second upper barrier film 212. The upper filling film 213 may fill the rest of the upper wiring trench 210t.

The upper surface of the first upper barrier film 211 is illustrated as being lower than the upper surface of the second upper barrier film 212 and the upper surface of the upper filling film 213, but embodiments are not limited thereto. Alternatively, the upper surface of the first upper barrier film 211 may be provided on the same plane as the upper surface of the second upper barrier film 212 and the upper surface of the upper filling film 213.

The first upper barrier film 211 may include, for example, a metal. The first upper barrier film 211 may include at least one of, for example, Ru, Mo, and Ti.

The second upper barrier film 212 may include at least one of, for example, Ta, Co, TaN, TiN, WN, ZrN, VN, and NbN.

The upper filling film 213 may include at least one of, for example, Al, Cu, W, Co, Ru, Ag, Au, Mn, Mo, Rh, Ir, RuAl, NiAl, $NbB_2$, $MoB_2$, $TaB_2$, $V_2AlC$, and CrAlC. Specifically, the upper filling film 213 may include Cu.

Figure 7:
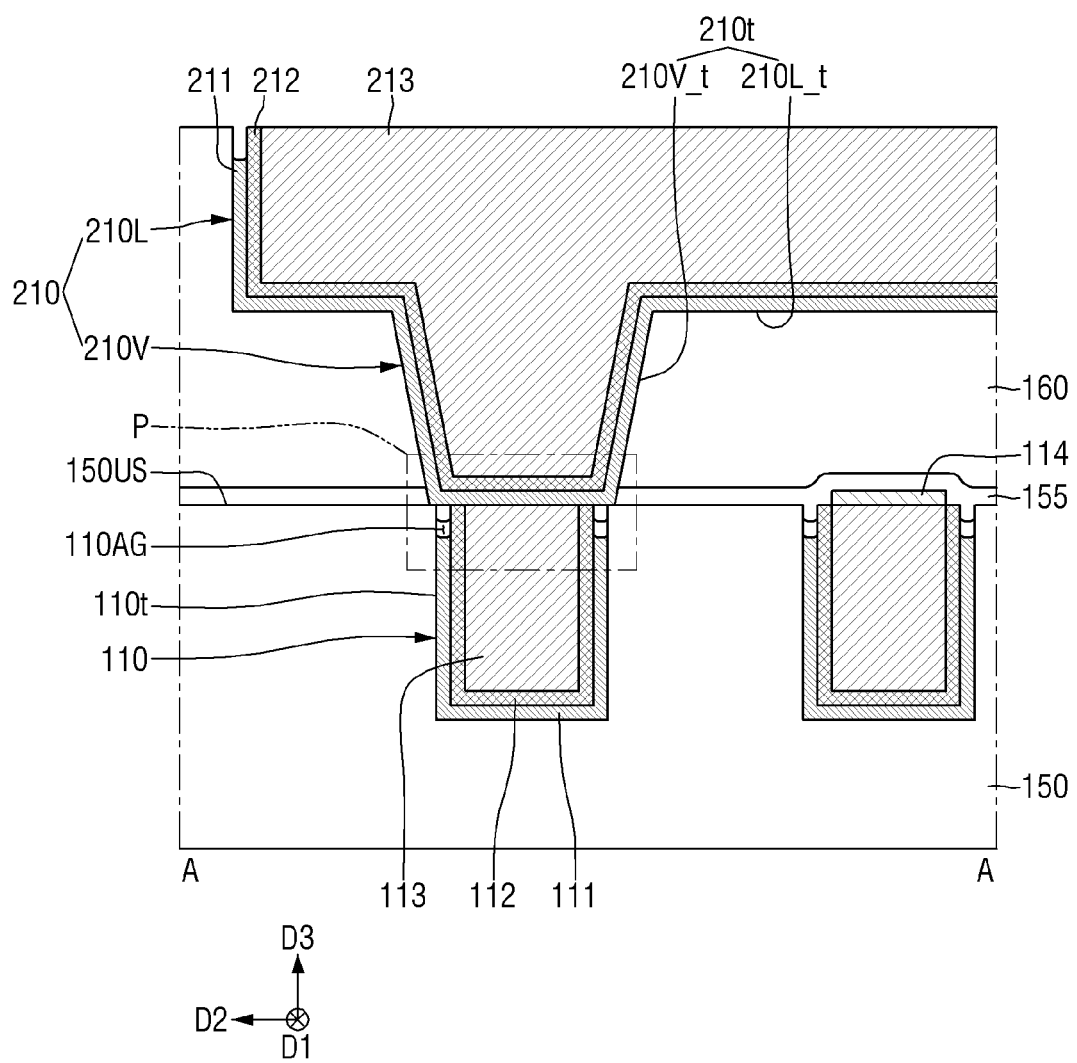
FIG. 7 is a cross-sectional view of a semiconductor device according to some embodiments.
Figure 8:
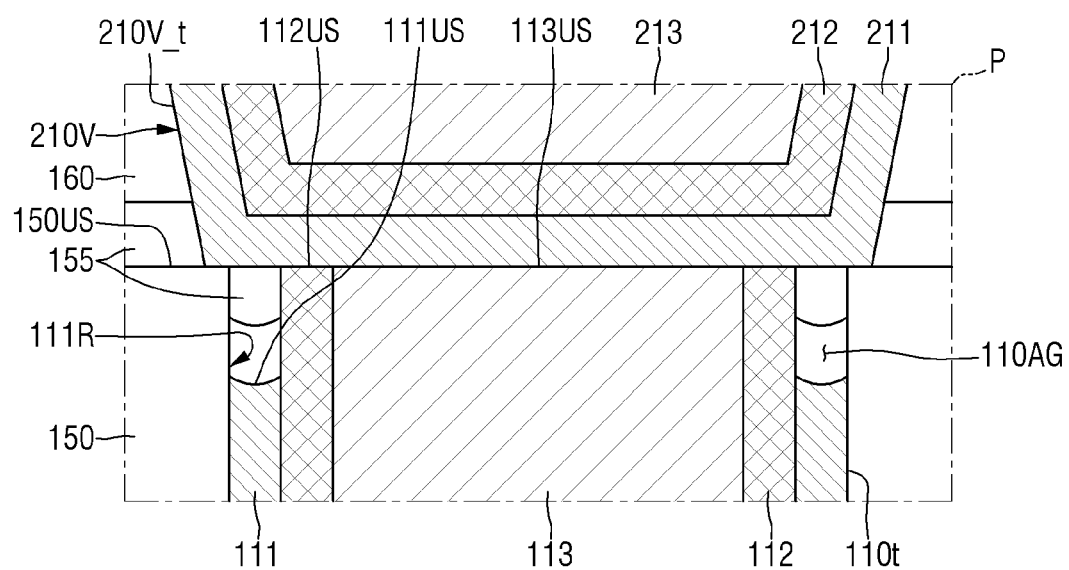
FIGS. 8 and 9 are enlarged cross-sectional views of part P of FIG. 7.
Figure 9:
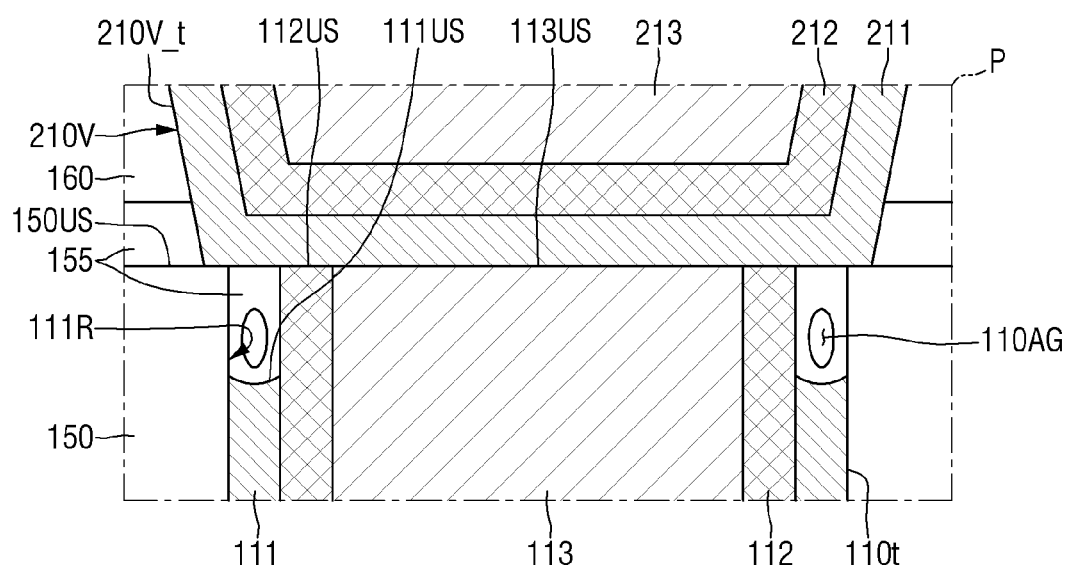

FIG. 7 is a cross-sectional view of a semiconductor device according to some embodiments. FIGS. 8 and 9 are enlarged cross-sectional views of part P of FIG. 7. For convenience, the embodiment of FIGS. 7 through 9 will hereinafter be described, focusing mainly on the differences with the embodiment of FIGS. 1 through 6.

Referring to FIGS. 7 through 9, the semiconductor device according to some embodiments may further include an air gap 110AG, which is disposed between a first interlayer insulating film 150 and a lower filling film 113.

Specifically, the air gap 110AG may be disposed between the first interlayer insulating film 150 and a second lower barrier film 112. An upper surface 111US of first lower barrier film 111 may be exposed to the air gap 110AG. The air gap 110AG may be disposed between the upper surface 111US of the first lower barrier film 111 and the bottom surface of an upper wiring structure 210.

A first etch stopper film 155 may fill part of a lower barrier film recess 111R. The air gap 110AG may fill the space that remains unfilled with the first etch stopper film 155.

Referring to FIG. 8, the air gap 110AG may be disposed between the first etch stopper film 155 and the first lower barrier film 111. The air gap 110AG may be surrounded by, and exposed to each of, the upper surface 111US of the first lower barrier film 111, the first interlayer insulating film 150, the second lower barrier film 112, and the first etch stopper film 155.

Referring to FIG. 9, the air gap 110AG may be disposed in part of the first etch stopper film 155 in the lower barrier film recess 110R. The air gap 110AG may be surrounded by the first etch stopper film 155. For example, the first etch stopper film 155 may separate the air gap 110AG from the upper surface 111US of the first lower barrier film 111, the first interlayer insulating film 150, the second lower barrier film 112, and the first upper barrier film 211.

Figure 10:
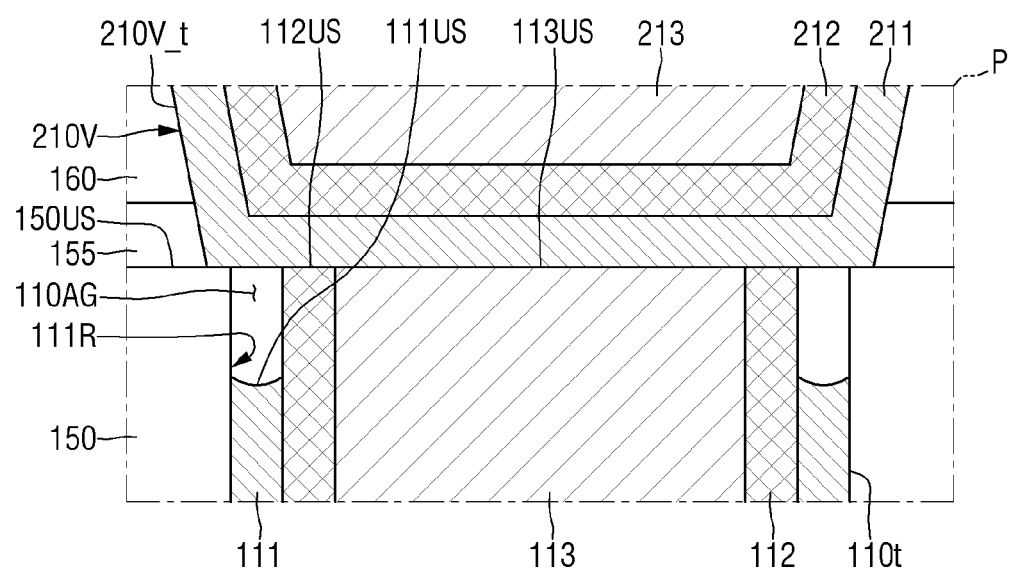
FIG. 10 is a cross-sectional view of a semiconductor device according to some embodiments.

FIG. 10 is a cross-sectional view of a semiconductor device according to some embodiments. For convenience, the embodiment of FIG. 10 will hereinafter be described, focusing mainly on the differences with the embodiment of FIGS. 1 through 6. Specifically, FIG. 10 is an enlarged cross-sectional view of part P (see FIG. 2) of a semiconductor device according to some embodiments.

Referring to FIG. 10, in the semiconductor device according to some embodiments, a first etch stopper film 155 may not be disposed in a lower barrier film recess 111R.

The first etch stopper film 155 does not fill the lower barrier film recess 111R.

An air gap 110AG may be disposed between a first interlayer insulating film 150 and a lower filling film 113 and between a first lower barrier film 111 and an upper wiring structure 210. For example, the air gap 110AG may be exposed to each of the upper surface 111US of the first lower barrier film 111, the first interlayer insulating film 150, the second lower barrier film 112, and the first upper barrier film 211.

Figure 11:
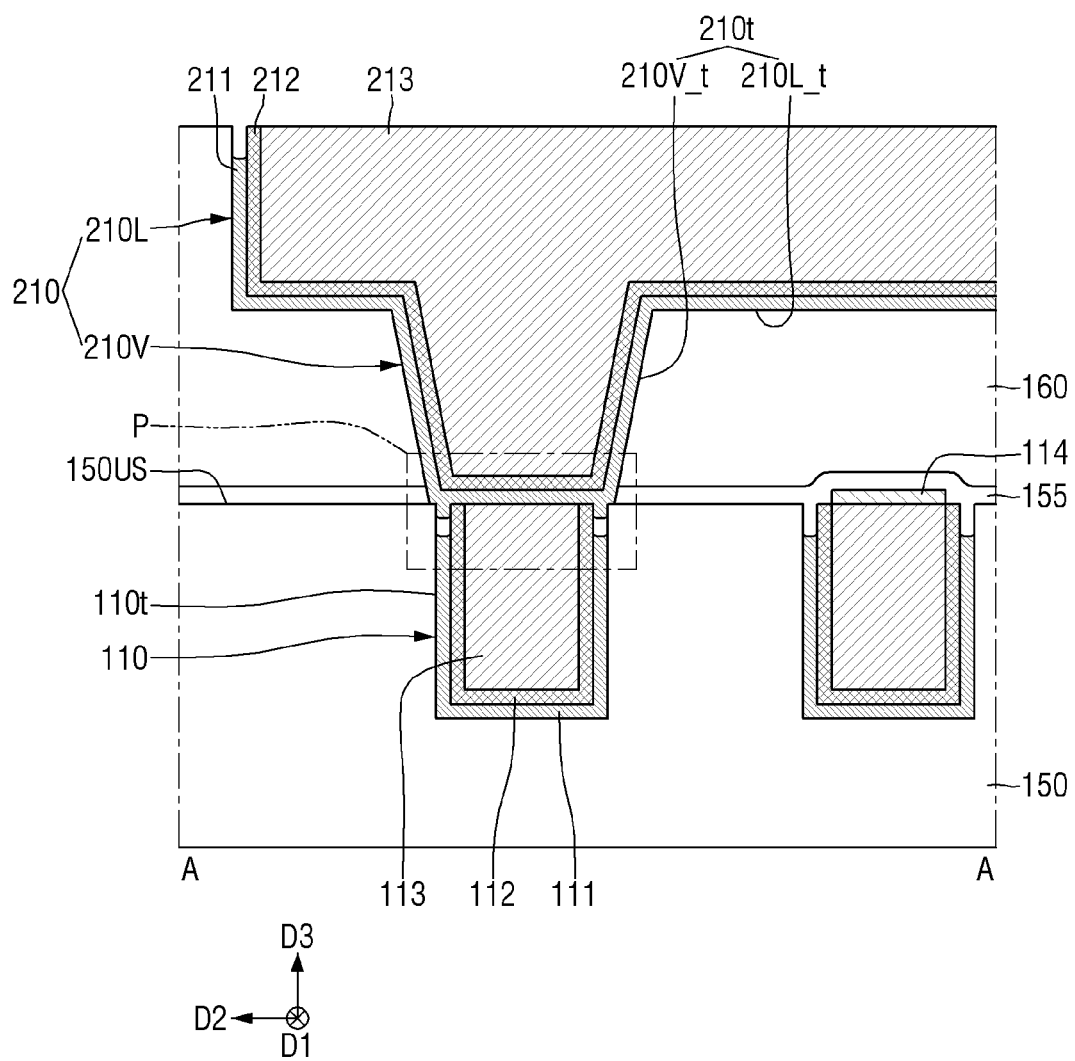
FIGS. 11 and 12 are cross-sectional views of a semiconductor device according to some embodiments.
Figure 12:
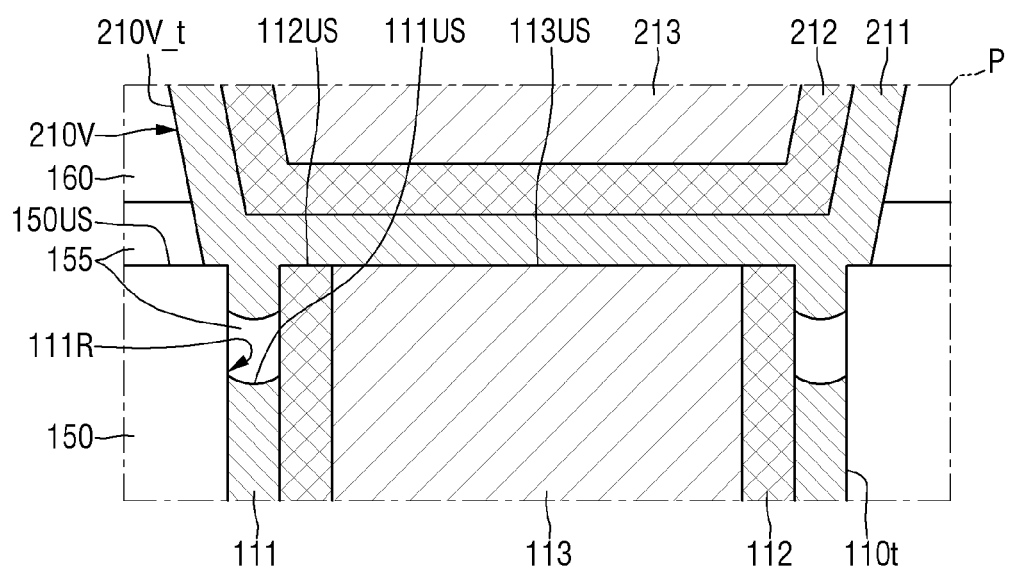

FIGS. 11 and 12 are cross-sectional views of a semiconductor device according to some embodiments. For convenience, the embodiment of FIGS. 11 and 12 will hereinafter be described, focusing mainly on the differences with the embodiment of FIGS. 1 through 6.

Specifically, FIG. 12 is an enlarged cross-sectional view of part P of FIG. 11.

Referring to FIGS. 11 and 12, in the semiconductor device according to some embodiments, a first upper barrier film 211 may extend into at least part of a lower barrier film recess 111R.

Part of the first upper barrier film 211 may be disposed in the lower barrier film recess 111R. Part of the first upper barrier film 211 may extend between a first interlayer insulating film 150 and a second lower barrier film 112.

The lowermost part of the first upper barrier film 211 may be lower than an upper surface 112US of a second lower barrier film 112 based on an upper surface 111US of a first lower barrier film 111.

For example, a first etch stopper film 155 may be disposed in part of the lower barrier film recess 111R that remains unfilled with the first upper barrier film 211.

As another example, an air gap 110AG may be disposed between the lowermost part of the first upper barrier film 211 and the upper surface 111US of the first lower barrier film 111. In another example, the first upper barrier film 211 may fill the entire lower barrier film recess 111R, in which case, the first upper barrier film 211 may be in contact with the upper surface 111US of the first lower barrier film 111.

Figure 13:
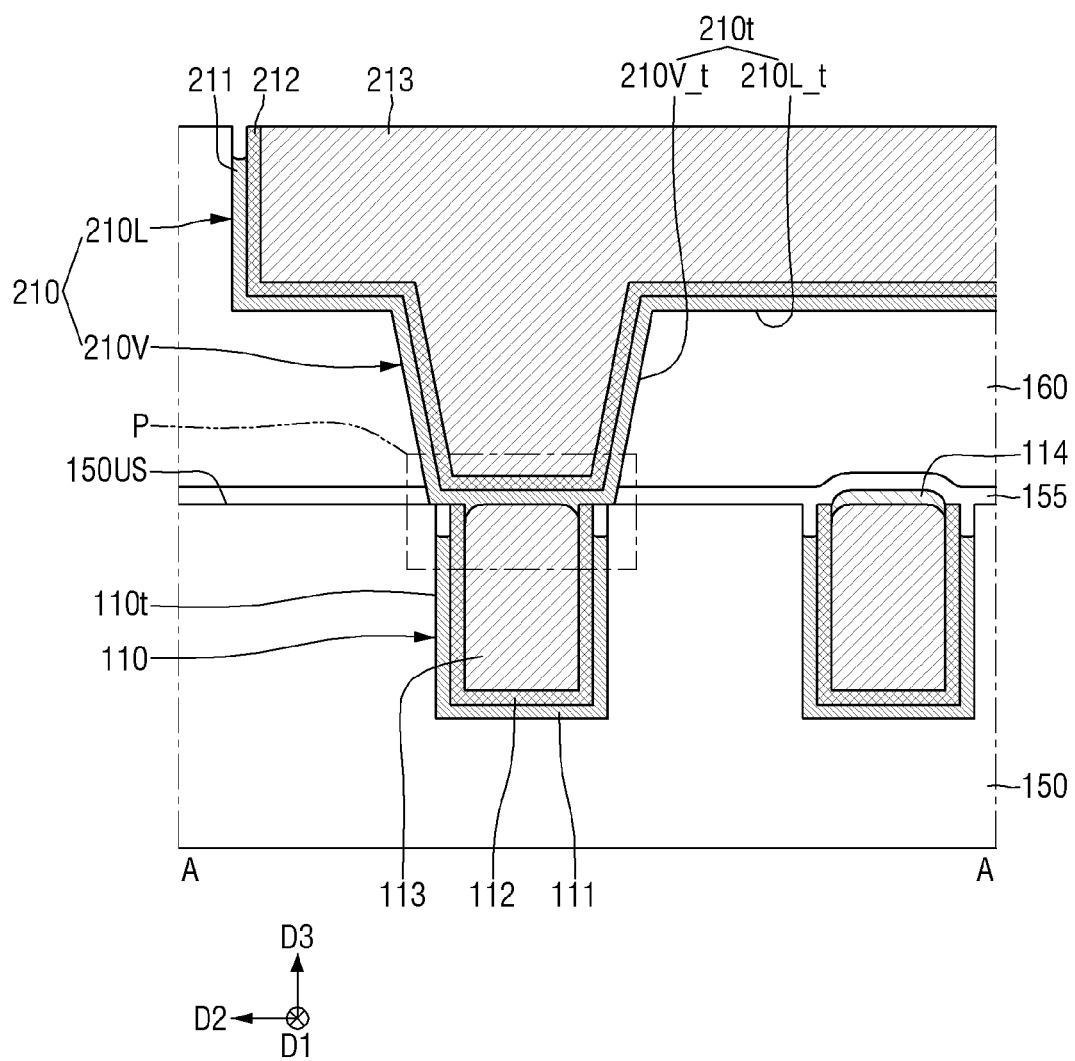
FIG. 13 is a cross-sectional view of a semiconductor device according to some embodiments.
Figure 14:
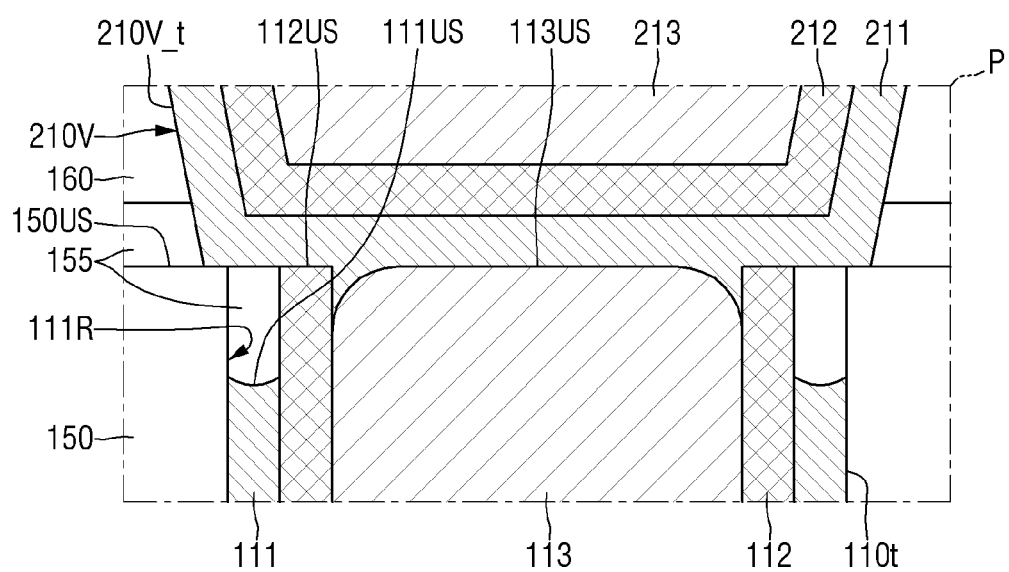
FIGS. 14 and 15 are enlarged cross-sectional views of part P of FIG. 13.
Figure 15:
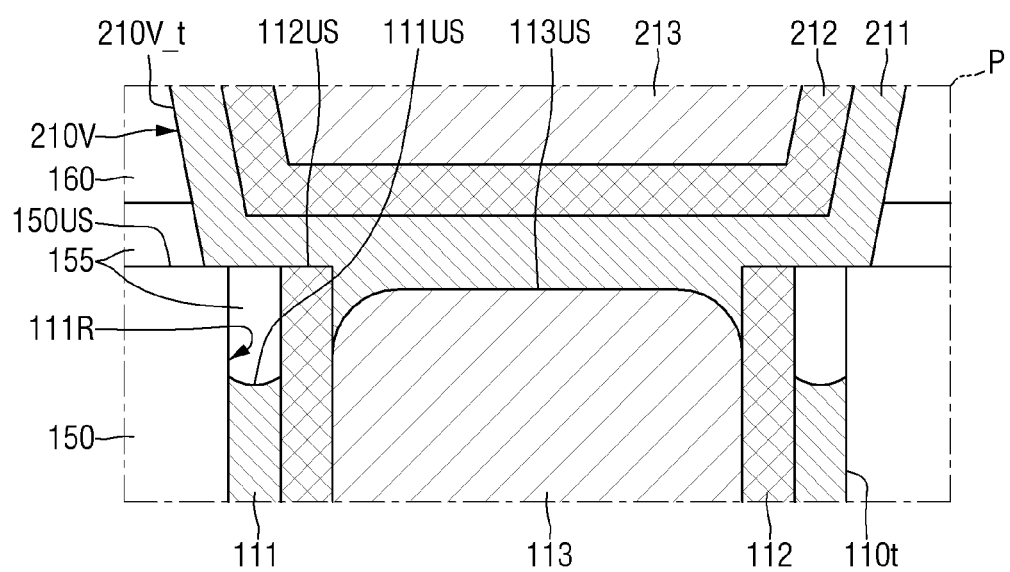

FIG. 13 is a cross-sectional view of a semiconductor device according to some embodiments. FIGS. 14 and 15 are enlarged cross-sectional views of part P of FIG. 13. For convenience, the embodiment of FIGS. 13 through 15 will hereinafter be described, focusing mainly on the differences with the embodiment of FIGS. 1 through 6.

Referring to FIGS. 13 through 15, in the semiconductor device according to some embodiments, an upper surface 113US of a lower filling film 113 may be partially convex.

The upper surface 113US of the lower filling film 113 may include a first portion that is flat and second portions that are convex. The first portion may be disposed between the second portions.

Alternatively, the entire upper surface 113US of the lower filling film 113 may be convex.

Referring to FIG. 14, the height of an upper surface 112US of a second lower barrier film 112 may be the same as the height of the upper surface 113US of the lower filling film 113 based on the bottom surface of a lower wiring trench 110t.

Referring to FIG. 15, the height of an upper surface 112US of a second lower barrier film 112 may be greater than the height of the upper surface 113US of the lower filling film 113 based on the bottom surface of a lower wiring trench 110t.

Figure 16:
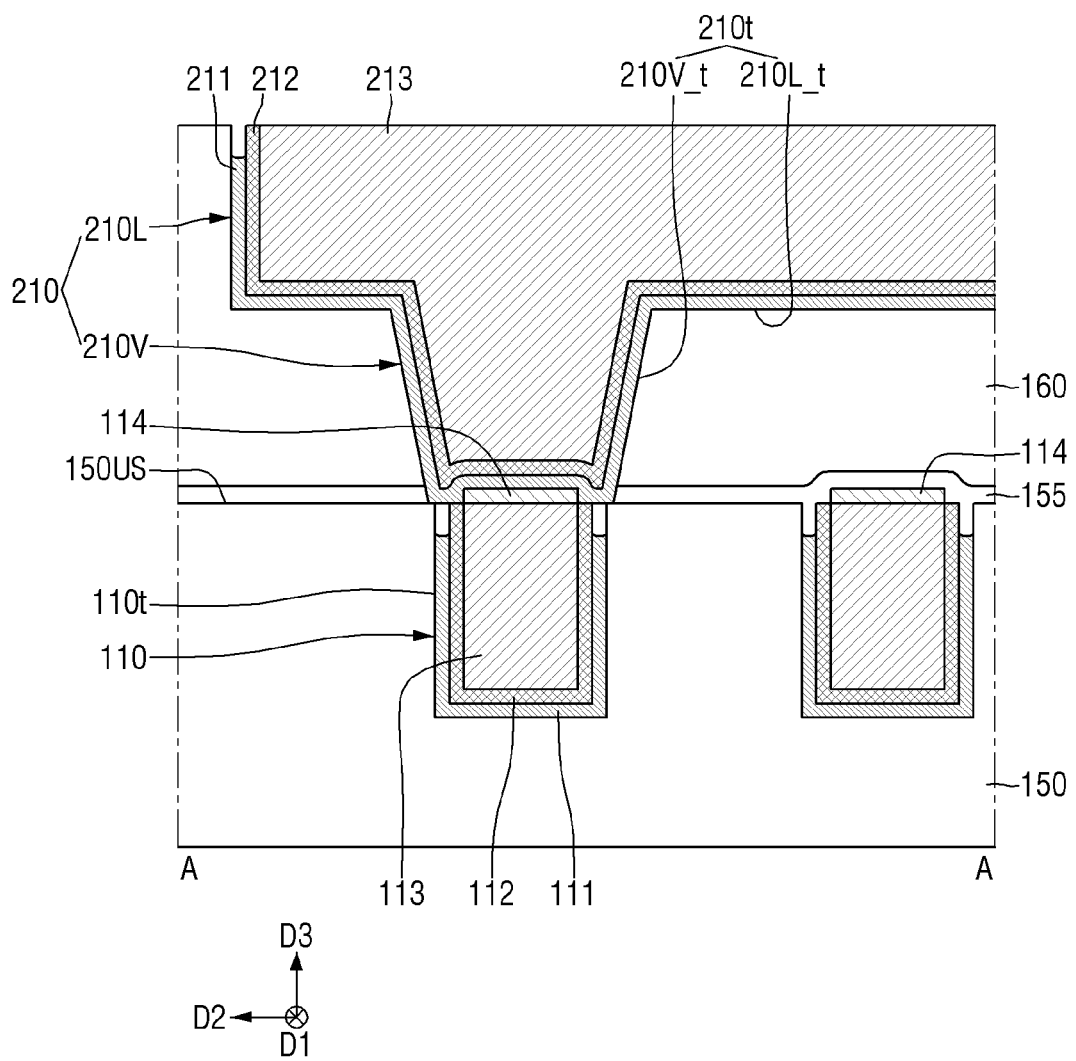
FIGS. 16 and 17 are cross-sectional views of a semiconductor device according to some embodiments.
Figure 17:
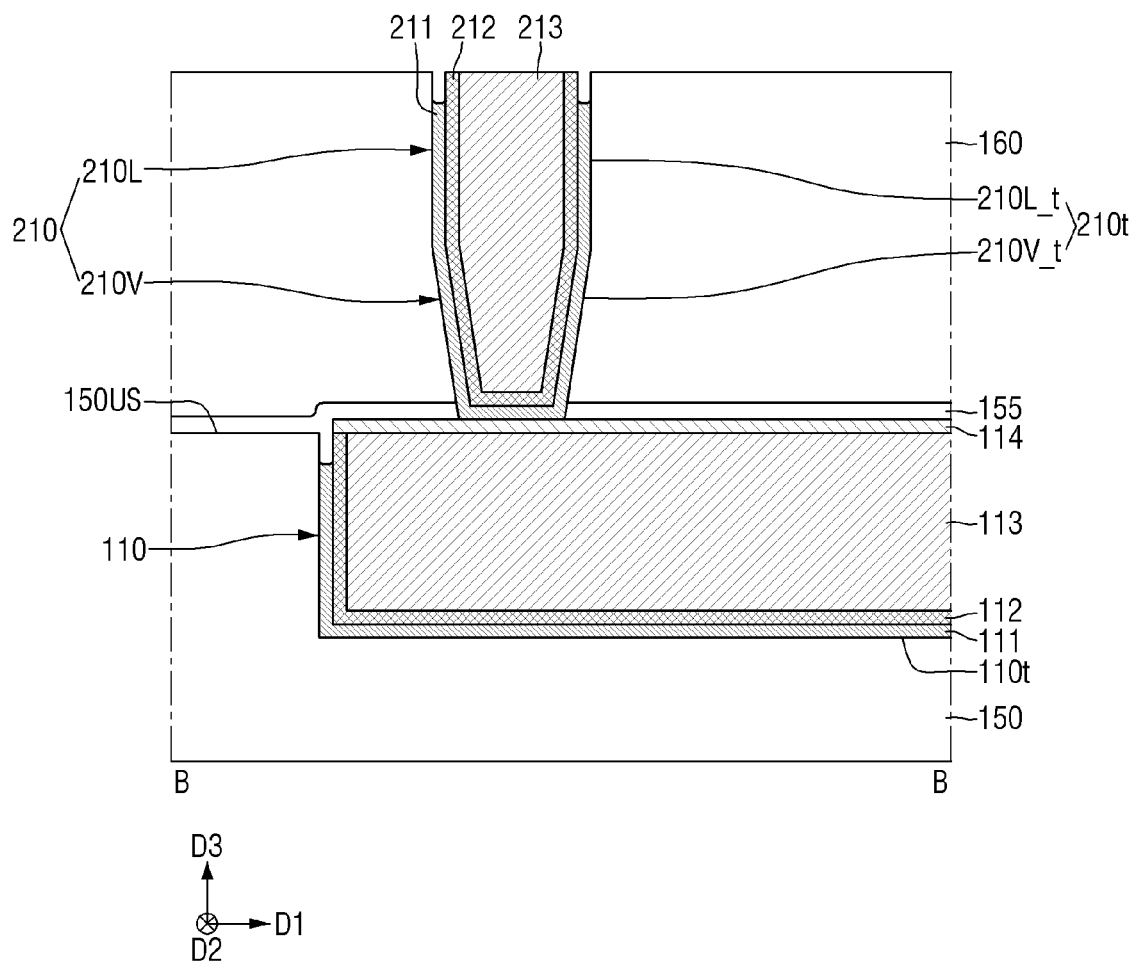

FIGS. 16 and 17 are cross-sectional views of a semiconductor device according to some embodiments. For convenience, the embodiment of FIGS. 16 and 17 will hereinafter be described, focusing mainly on the differences with the embodiment of FIGS. 1 through 6. FIG. 16 is a cross-sectional view corresponding to line A-A of FIG. 1. FIG. 17 is a cross-sectional view corresponding to line B-B of FIG. 1.

Referring to FIGS. 16 and 17, in the semiconductor device according to some embodiments, a first upper barrier film 211 may be in contact with a lower capping film 114.

An upper wiring trench 210t does not penetrate the lower capping film 114. The upper wiring trench 210t does not expose an upper surface 113US of a lower filling film 113.

The sidewalls of an upper via trench 210V_t are not defined by the lower capping film 114. The bottom surface of the upper wiring trench 210t may be defined by the lower capping film 114.

The lower capping film 114 may have a bottom surface facing the lower filling film 113 and an upper surface facing a first etch stopper film 155. The first upper barrier film 211 may be in contact with the upper surface of the lower capping film 114.

Figure 18:
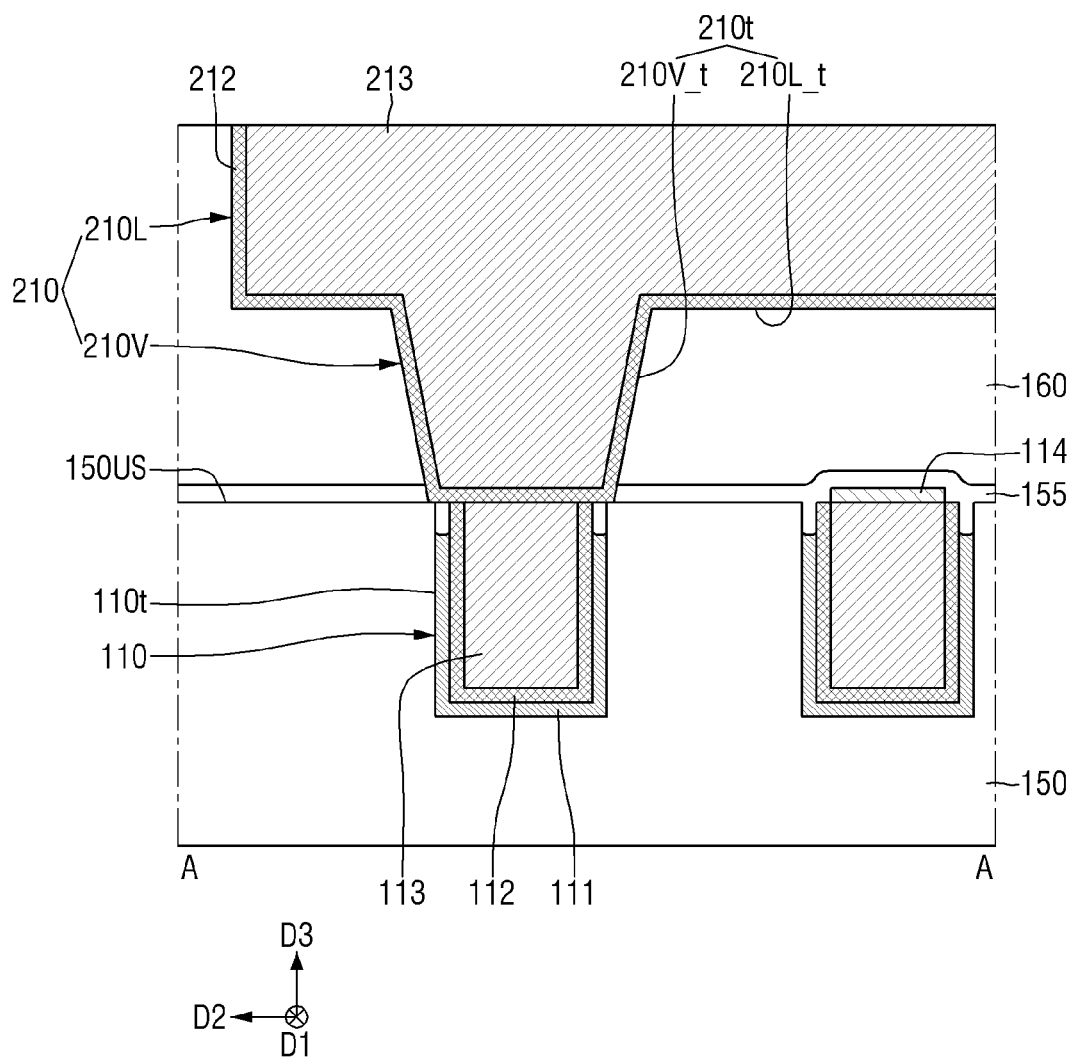
FIG. 18 is a cross-sectional view of a semiconductor device according to some embodiments.

FIG. 18 is a cross-sectional view of a semiconductor device according to some embodiments. For convenience, the embodiment of FIG. 18 will hereinafter be described, focusing mainly on the differences with the embodiment of FIGS. 1 through 6.

Referring to FIG. 18, in the semiconductor device according to some embodiments, the number of barrier films included in an upper wiring structure 210 may differ from the number of barrier films included in a lower wiring structure 110.

For example, the number of barrier films included in the upper wiring structure 210 may be less than the number of barrier films included in the lower wiring structure 110.

The upper wiring structure 210 may include a second upper barrier film 212 and an upper filling film 213. The upper wiring structure 210 does not include a first upper barrier film 211. The second upper barrier film 212 may be in contact with a second interlayer insulating film 160.

Figure 19:
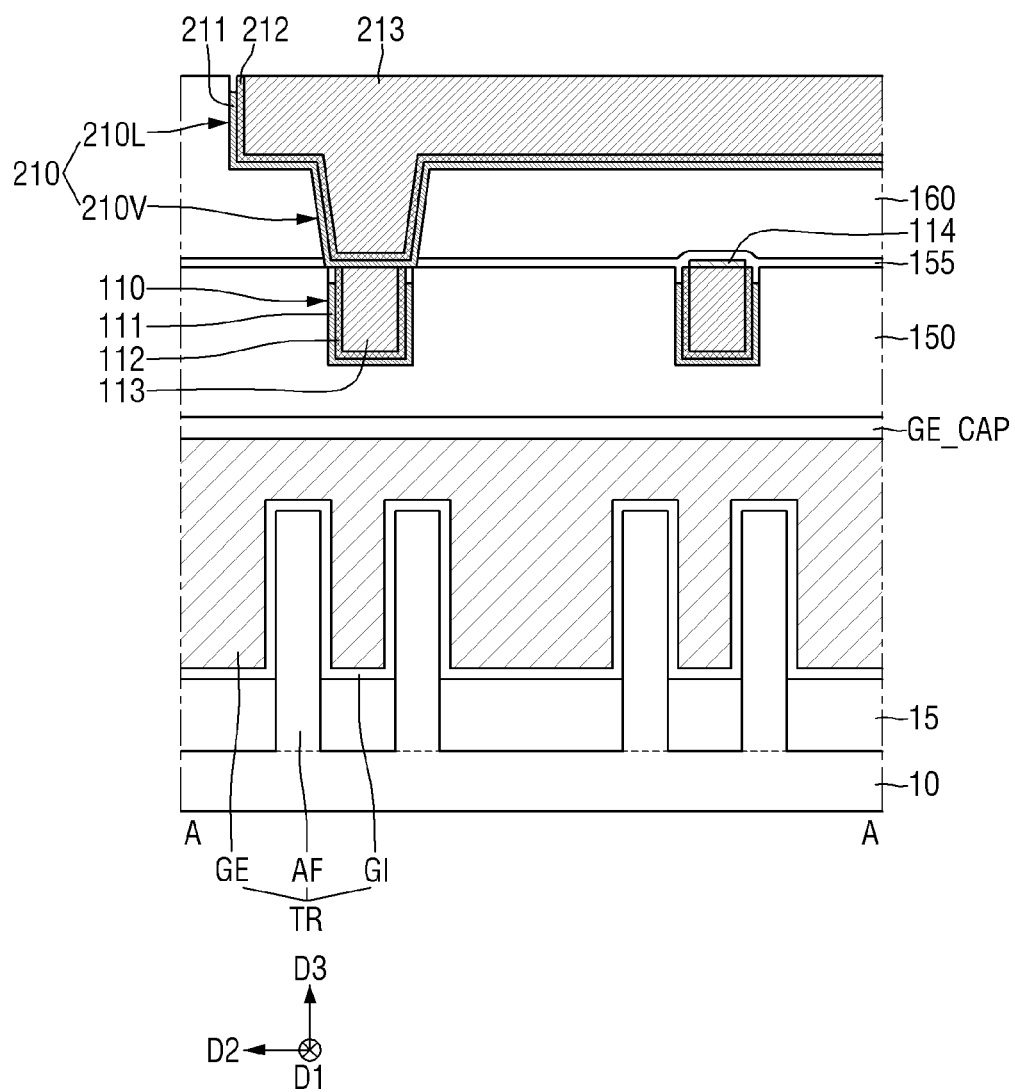
FIG. 19 is a cross-sectional view of a semiconductor device according to some embodiments.

FIG. 19 is a cross-sectional view of a semiconductor device according to some embodiments. For convenience, the embodiment of FIG. 19 will hereinafter be described, focusing mainly on the differences with the embodiment of FIGS. 1 through 6.

Specifically, FIG. 19 is a cross-sectional view taken across a first gate electrode GE.

Referring to FIG. 19, in the semiconductor device according to some embodiments, fin-type patterns AF may extend in a first direction D1, and the first gate electrode GE may extend in a second direction D2. However, embodiments are not limited thereto.

The semiconductor device according to some embodiments may include transistors TR, which are disposed between a substrate 10 and a lower wiring structure 110.

The substrate 10 may be a silicon (Si) substrate or a silicon-on-insulator (SOI). Alternatively, the substrate 10 may include silicon germanium (SiGe), a silicon germanium-on-insulator (SGOI), indium antimonide, a lead tellurium compound, indium arsenide, indium phosphide, gallium arsenide, or gallium antimonide, but embodiments are not limited thereto.

The transistors TR may include the fin-type patterns AF, the first gate electrode GE, which is on the fin-type patterns AF, and a first gate insulating film GI, which is disposed between the first gate electrode GE and the fin-type patterns AF.

Additionally, the transistors TR may include source/drain patterns disposed on both sides of the first gate electrode GE.

The fin-type patterns AF may protrude from the substrate 10 in the third direction D3. The fin-type patterns AF may extend in the first direction D1. The fin-type patterns AF may be parts of the substrate 10 or may include an epitaxial layer grown from the substrate 10. The fin-type patterns AF may include, for example, an element semiconductor material such as Si or germanium (Ge). Alternatively, the fin-type patterns AF may include a compound semiconductor such as, for example, a group IV-IV compound semiconductor or a group III-V compound semiconductor.

The group IV-IV compound semiconductor may be a binary or ternary compound including at least two of C, Si, Ge, and tin (Sn) or a compound obtained by doping the binary or ternary compound with a group IV element. The group III-V compound semiconductor may be a binary, ternary, or quaternary compound obtained by combining at least one group III element such as Al, Ga, or In and a group V element such as phosphorus (P), arsenic (As), or antimony (Sb).

A field insulating film 15 may be formed on the substrate 10. The field insulating film 15 may be formed on parts of the sidewalls of each of the fin-type patterns AF. The fin-type patterns AF may protrude beyond the upper surface of the field insulating film 15. The field insulating film 15 may include, for example, an oxide film, a nitride film, an oxynitride film, or a combination thereof.

The first gate electrode GE may be disposed on the fin-type patterns AF. The first gate electrode GE may extend in the second direction D2. The first gate electrode GE may intersect the fin-type patterns AF.

The first gate electrode GE may include at least one of, for example, a metal, a conductive metal nitride, a conductive metal carbonitride, a conductive metal carbide, a metal silicide, a doped semiconductor material, a conductive metal oxynitride, and a conductive metal oxide.

The first gate insulating film GI may be disposed between the first gate electrode GE and the fin-type patterns AF and between the first gate electrode GE and the field insulating film 15. The first gate insulating film GI may include, for example, silicon oxide, silicon oxynitride, silicon nitride, or a high-k material having a greater dielectric constant than silicon oxide. The high-k material may include at least one of, for example, boron nitride, a metal oxide, and a metal silicon oxide.

The semiconductor device according to some embodiments may include negative capacitance (NC) FETs using negative capacitors. For example, the first gate insulating film GI may include a ferroelectric material film having ferroelectric properties and a paraelectric material film having paraelectric properties.

The ferroelectric material film may have negative capacitance, and the paraelectric material film may have positive capacitance. For example, if two or more capacitors are connected in series and have positive capacitance, the total capacitance of the two or more capacitors may be lower than the capacitance of each of the two or more capacitors. On the contrary, if at least one of the two or more capacitors has negative capacitance, the total capacitance of the two or more capacitors may have a positive value and may be greater than the absolute value of the capacitance of each of the two or more capacitors.

If the ferroelectric material film having negative capacitance and the paraelectric material film having positive capacitance are connected in series, the total capacitance of the ferroelectric material film and the paraelectric material film may increase. Accordingly, a transistor having the ferroelectric material film can have a sub-threshold swing (SS) of less than 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. For example, the hafnium zirconium oxide may be a material obtained by doping hafnium oxide with zirconium (Zr). In another example, the hafnium zirconium oxide may be a compound of hafnium (Hf), Zr, and oxygen (O).

The ferroelectric material film may further include a dopant. For example, the dopant may include at least one of Al, Ti, Nb, lanthanum (La), yttrium (Y), magnesium (Mg), silicon, calcium (Ca), cerium (Ce), dysprosium (Dy), erbium (Er), gadolinium (Gd), germanium, scandium (Sc), strontium (Sr), and tin (Sn). The type of dopant may vary depending on the type of material of the ferroelectric material film.

If the ferroelectric material film includes hafnium oxide, the dopant of the ferroelectric material film may include, for example, at least one of Gd, Si, Zr, Al, and Y.

If the dopant of the ferroelectric material film is Al, the ferroelectric material film may include 3 atomic % (at %) to 8 at % of Al. Here, the ratio of the dopant in the ferroelectric material film may refer to the ratio of the sum of the amounts of Hf and Al to the amount of Al in the ferroelectric material film.

If the dopant of the ferroelectric material film is Si, the ferroelectric material film may include 2 at % to 10 at % of Si. If the dopant of the ferroelectric material film is Y, the ferroelectric material film may include 2 at % to 10 at % of Y. If the dopant of the ferroelectric material film is Gd, the ferroelectric material film may include 1 at % to 7 at % of Gd. If the dopant of the ferroelectric material film is Zr, the ferroelectric material film may include 50 at % to 80 at % of Zr.

The paraelectric material film may include paraelectric properties. The paraelectric material film may include, for example, at least one of silicon oxide and a high-k metal oxide. The high-k metal oxide may include, for example, at least one of hafnium oxide, zirconium oxide, and aluminum oxide, but embodiments are not limited thereto.

The ferroelectric material film and the paraelectric material film may include the same material. The ferroelectric material film may have ferroelectric properties, but the paraelectric material film may not have ferroelectric properties. For example, if the ferroelectric material film and the paraelectric material film include hafnium oxide, the hafnium oxide included in the ferroelectric material film may have a different crystalline structure from the hafnium oxide included in the paraelectric material film.

The ferroelectric material film may be thick enough to exhibit ferroelectric properties. The ferroelectric material film may have a thickness of, for example, 0.5 nm to 10 nm, but embodiments are not limited thereto. A critical thickness that can exhibit ferroelectric properties may vary depending on the type of ferroelectric material, and thus, the thickness of the ferroelectric material film may vary depending on the type of ferroelectric material included in the ferroelectric material film.

For example, the first gate insulating film GI may include one ferroelectric material film. In another example, the first gate insulating film GI may include a plurality of ferroelectric material films that are spaced apart from one another. The first gate insulating film GI may have a structure in which a plurality of ferroelectric material films and a plurality of paraelectric material films are alternately stacked.

A gate capping pattern GE_CAP may be disposed on the first gate electrode GE. The lower wiring structure 110 may be disposed on the first gate electrode GE. The lower wiring structure 110 is illustrated as not being connected to the first gate electrode GE, but embodiments are not limited thereto. For example, at least one lower wiring structure 110 may be connected to the first gate electrode GE.

Figure 20:
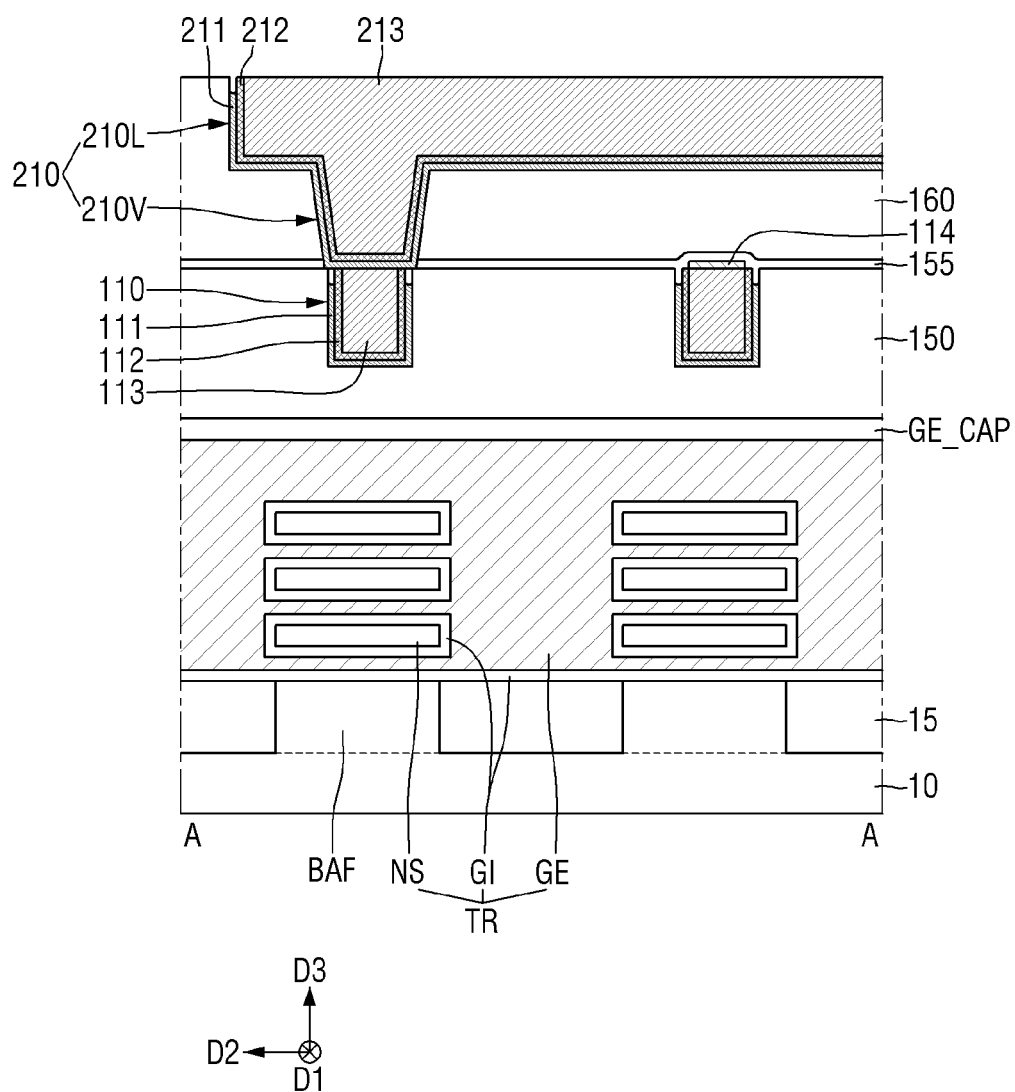
FIG. 20 is a cross-sectional view of a semiconductor device according to some embodiments.

FIG. 20 is a cross-sectional view of a semiconductor device according to some embodiments. For convenience, the embodiment of FIG. 20 will hereinafter be described, focusing mainly on the differences with the embodiment of FIG. 19.

Referring to FIG. 20, in the semiconductor device according to some embodiments, transistors TR may include nanosheets NS, a first gate electrode GE, which surrounds the nanosheets NS, and first gate insulating films GI, which are between the first gate electrode GE and the nanosheets NS.

The nanosheets NS may be disposed on lower fin-type patterns BAF. The nanosheets NS may be spaced apart from the lower fin-type patterns BAF in a third direction D3. Each of the transistors TR is illustrated as including three nanosheets NS, which are spaced apart from one another in the third direction D3, but embodiments are not limited thereto. Alternatively, more than three nanosheets NS, or less than three nanosheets NS, may be disposed on each of the lower fin-type patterns BAF in the third direction D3.

The lower fin-type patterns BAF and the nanosheets NS may include an element semiconductor material such as, for example, Si or Ge. The lower fin-type patterns NS and the nanosheets NS may include a compound semiconductor such as, for example, a group IV-IV compound semiconductor or a group III-V compound semiconductor. The lower fin-type patterns BAF and the nanosheets NS may include the same material or may include different materials.

Figure 21:
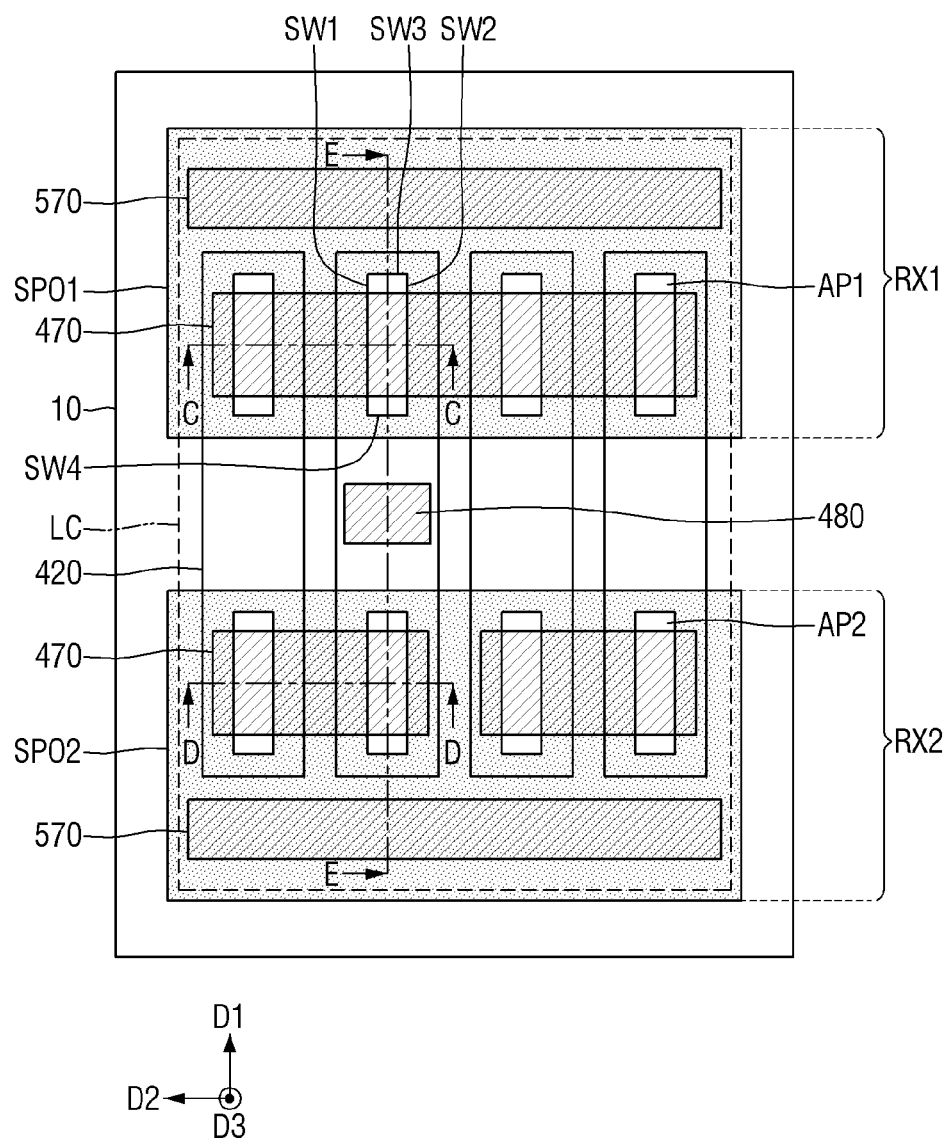
FIGS. 21 through 23 illustrate a semiconductor device according to some embodiments.
Figure 22:
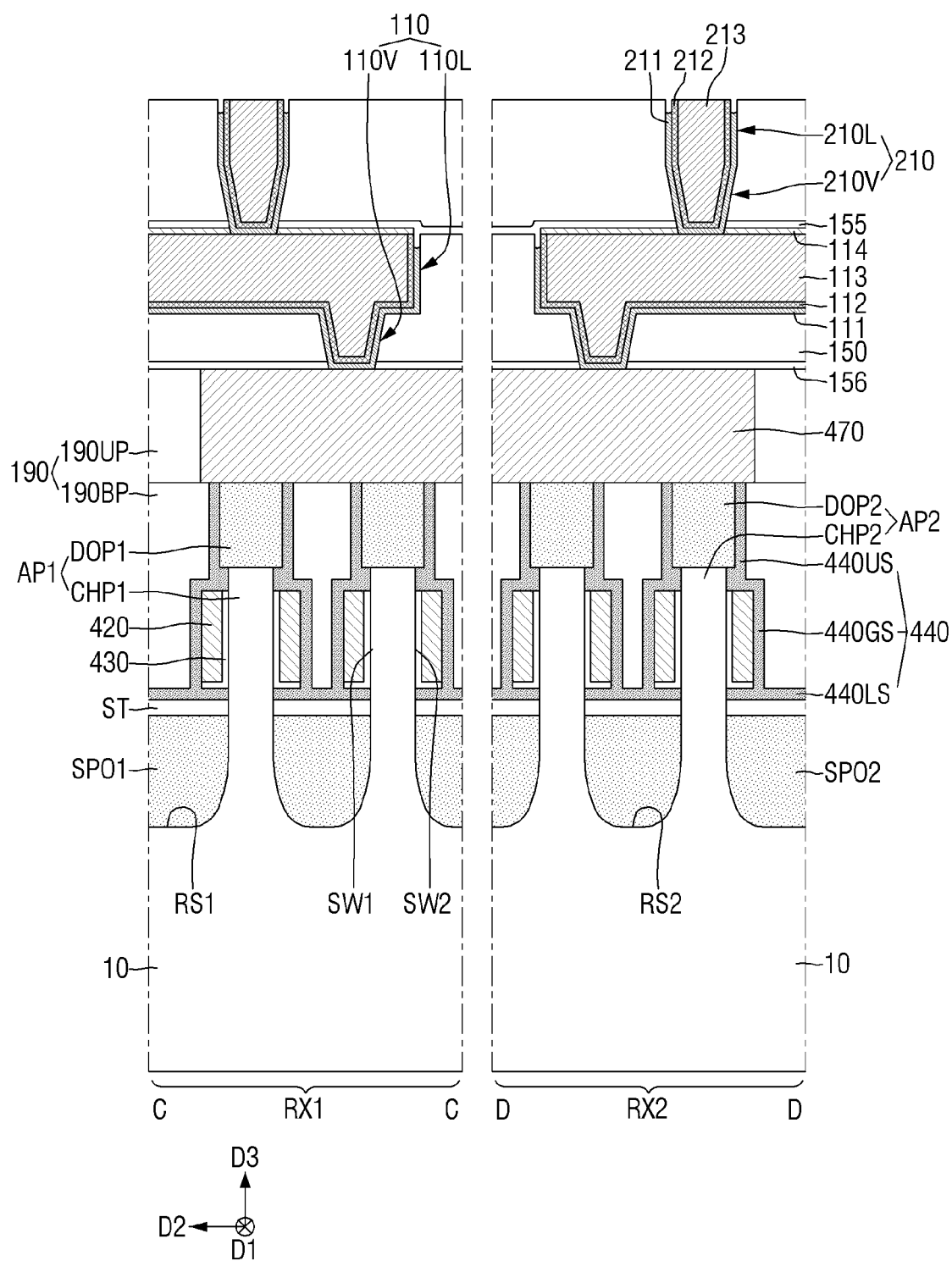
Figure 23:
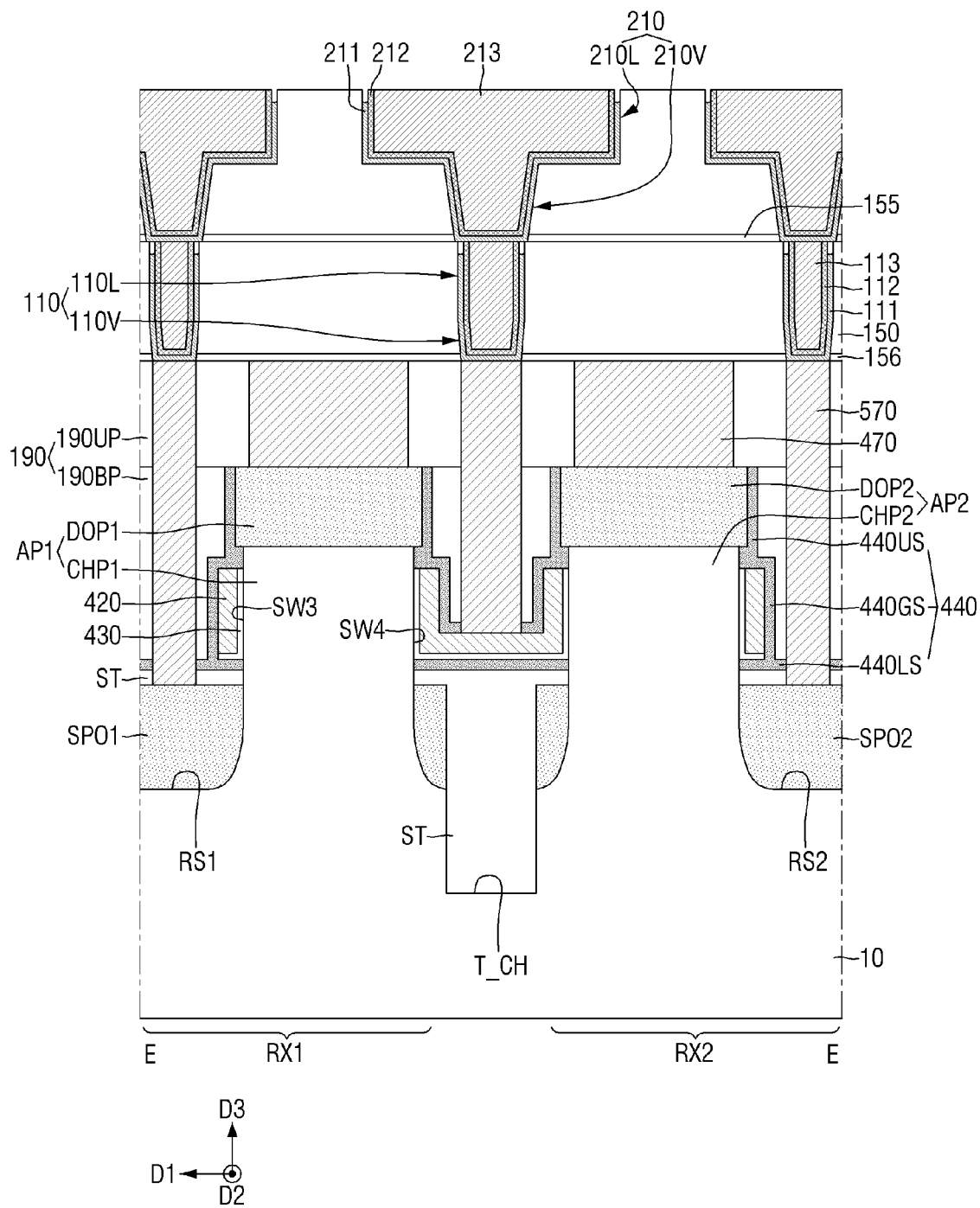

FIGS. 21 through 23 illustrate a semiconductor device according to some embodiments. Specifically, FIG. 21 is a plan view of a semiconductor device according to some embodiments, FIG. 22 is a cross-sectional view taken along lines C-C and D-D of FIG. 21, and FIG. 23 is a cross-sectional view taken along line E-E of FIG. 21.

Referring to FIGS. 21 through 23, a logic cell LC may be provided on a substrate 10. The logic cell LC may be a logic element (e.g., an inverter, a flipflop, or the like) performing a particular function. The logic cell LC may include vertical FETs, which form a logic element, and wires, which connect the vertical FETs.

The logic cell LC on the substrate 10 may include first and second active regions RX1 and RX2. For example, the first active region RX1 may be a P-type metal-oxide semiconductor (MOSFET) region, and the second active region RX2 may be an N-type MOSFET region. The first and second active regions RX1 and RX2 may be defined by a trench T_CH, which is formed in the substrate 10. The first and second active regions RX1 and RX2 may be spaced apart from each other in a first direction D1.

First lower epitaxial patterns SPO1 may be provided in the first active region RX1, and second lower epitaxial patterns SPO2 may be provided in the second active region RX2. In a plan view, the first lower epitaxial pattern SPO1 may overlap with the first active region RX1, and the second lower epitaxial pattern SPO2 may overlap with the second active region RX2. The first lower epitaxial patterns SPO1 and the second lower epitaxial patterns SPO2 may be obtained by a selective epitaxial growth process. The first lower epitaxial patterns SPO1 may be provided in first recess regions RS1 of the substrate 10, and the second lower epitaxial patterns SPO2 may be provided in second recess regions RS2 of the substrate 10.

First active patterns AP1 may be provided in the first active region RX1, and second active patterns AP2 may be provided in the second active region RX2. The first active patterns AP1 and the second active patterns AP2 may have a fin shape protruding vertically. In a plan view, the first active patterns AP1 and the second active patterns AP2 may have a bar shape extending in the first direction D1. The first active patterns AP1 may be arranged along the second direction D2, and the second active patterns AP2 may be arranged along the second direction D2.

The first active patterns AP1 may include first channel patterns CHP1, which protrude vertically from the first lower epitaxial patterns SPO1, and first upper epitaxial patterns DOP1, which are on the first channel patterns CHP1. The second active patterns AP2 may include second channel patterns CHP2, which protrude vertically from the second lower epitaxial patterns SPO2, and second upper epitaxial patterns DOP2, which are on the second channel patterns CHP2.

A device isolation film ST may be provided on the substrate 10 to fill the trench T_CH. The device isolation film ST may be provided on, and for example may cover, the upper surfaces of the first lower epitaxial patterns SPO1 and the second lower epitaxial patterns SPO2. The first active patterns AP1 and the second active patterns AP2 may protrude vertically from the device isolation film ST.

A plurality of second gate electrodes 420, which extend in parallel to one another in the first direction D1, may be provided on the device isolation film ST. The second gate electrodes 420 may be arranged along the second direction D2. The second gate electrodes 420 may surround the second channel patterns CHP2 of the second active patterns AP2. For example, each of the first channel patterns CHP1 may include first through fourth sidewalls SW1 through SW4. The first and second sidewalls SW1 and SW2 may be opposite to each other in the second direction D2, and the third and fourth sidewalls SW3 and SW4 may be opposite to each other in the first direction D1. The second gate electrodes 420 may be provided on the first through fourth sidewalls SW1 through SW4 of each of the first channel patterns CHP1. Thus, the second gate electrodes 420 may surround the first through fourth sidewalls SW1 through SW4 of each of the first channel patterns CHP1.

Second gate insulating films 430 may be interposed between the second gate electrodes 420 and the first channel patterns CHP1 and between the second gate electrodes 420 and the second channel patterns CHP2. The second gate insulating films 430 may be provided on, and for example may cover, the bottom surface and the inner sidewalls of each of the second gate electrodes 420. For example, the second gate insulating films 430 may directly cover the first through fourth sidewalls SW1 through SW4 of each of the first active patterns AP1.

The first upper epitaxial patterns DOP1 and the second upper epitaxial patterns DOP2 may protrude vertically from the second gate electrodes 420. The upper surfaces of the second gate electrodes 420 may be lower than the bottom surfaces of the first upper epitaxial patterns DOP1 and the bottom surfaces of the second upper epitaxial patterns DOP2. Thus, the first active patterns AP1 and the second active patterns AP2 may protrude vertically from the substrate 10 to penetrate the second gate electrodes 420.

The semiconductor device according to some embodiments may include vertical FETs where carriers move in the third direction D3. For example, when the vertical FETs are on in response to a voltage being applied to the second gate electrodes 420, carriers may move from the first or second lower epitaxial patterns SPO1 or SPO2 to the first or second upper epitaxial patterns DOP1 or DOP2 through the first or second channel patterns CHP1 or CHP2. The second gate electrodes 420 may surround the first through fourth sidewalls of each of the first or second channel patterns CHP1 or CHP2. The transistor according to the present disclosure may be a three-dimensional field effect transistor (for example vertical FET(VFET)) having a gate-all-around structure. As channels are surrounded by gates, the semiconductor device according to some embodiments can have excellent electrical properties.

A spacer 440, which may be provided on, and for example may cover, the second gate electrodes 420, the first active patterns AP1, and the second active patterns AP2, may be provided on the device isolation film ST. The spacer 440 may include a silicon nitride film or a silicon oxynitride film. The spacer 440 may include a lower spacer 440LS, an upper spacer 440US, and a gate spacer 440GS between the lower and upper spacers 440LS and 440US.

The lower spacer 440LS may directly cover the upper surface of the device isolation film ST. Due to the lower spacer 440LS, the second gate electrodes 420 may be spaced apart from the device isolation film ST in the third direction D3. The gate spacer 440GS may be provided on, and for example may cover, the upper surface and the outer sidewalls of each of the second gate electrodes 420. The upper spacer 440US may be provided on, and for example may cover, the first upper epitaxial patterns DOP1 and the second upper epitaxial patterns DOP2, but may expose the upper surfaces of the first upper epitaxial patterns DOP1 and the upper surfaces of the second upper epitaxial patterns DOP2.

A first part 190BP of a lower interlayer insulating film 190 may be provided on the spacer 440. The upper surface of the first part 190BP of the lower interlayer insulating film 190 may form substantially the same plane as the upper surfaces of the first upper epitaxial patterns DOP1 and the upper surfaces of the second upper epitaxial patterns DOP2. A second part 190UP of the lower interlayer insulating film 190 and first and second interlayer insulating films 150 and 160 may be sequentially stacked on the first part 190BP of the lower interlayer insulating film 190. The second part 190UP of the lower interlayer insulating film 190 may be provided on, and for example may cover, the upper surfaces of the first upper epitaxial patterns DOP1 and the upper surfaces of the second upper epitaxial patterns DOP2.

One or more first source/drain contacts 470, which are connected to the first upper epitaxial patterns DOP1 and the second upper epitaxial patterns DOP2 through the second part 190UP of the lower interlayer insulating film 190, may be provided. One or more second source/drain contacts 570, which are connected to the first lower epitaxial patterns SPO1 and the second lower epitaxial patterns SPO2 sequentially through the lower interlayer insulating film 190, the lower spacer 440LS, and the device isolation film ST, may be provided. A gate contact 480, which is connected to the second gate electrodes 420 sequentially through the second part 190UP of the lower interlayer insulating film 190, the first part 190BP of the lower interlayer insulating film 190, and the gate spacer 440GS, may be provided.

A second etch stopper film 156 may be additionally disposed between the second part 190UP of the lower interlayer insulating film 190 and the first interlayer insulating film 150. A first etch stopper film 155 may be disposed between the first and second interlayer insulating films 150 and 160.

Lower wiring structures 110 may be provided in the first interlayer insulating film 150. The lower wiring structures 110 may include lower vias 110V and lower wiring lines 110L. The lower vias 110V and the lower wiring lines 110L may be similar to upper vias 210V and upper wiring lines 210L, respectively. However, the lower wiring structures 110 may have a different layer structure from, or the same layer structure as, upper wiring structures 210.

The lower wiring structures 110 may be connected to the first source/drain contacts 470, the second source/drain contacts 570, and the gate contact 480. The upper wiring structures 210 may be provided in the second interlayer insulating film 160.

Additional wiring structures may be further disposed, for example, between the first source/drain contacts 470 and the lower wiring structures 110.

The upper wiring structures 210 may be substantially the same as their counterpart of any one of FIGS. 1 through 18.

FIGS. 24 through 29 are cross-sectional views illustrating a method of fabricating a semiconductor device according to some embodiments.

Figure 24:
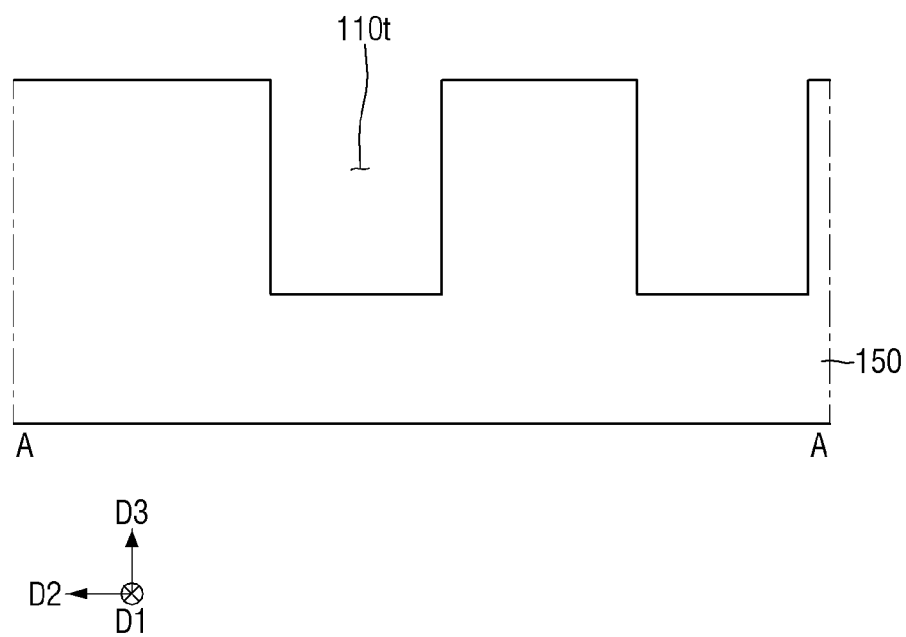
FIGS. 24 through 29 are cross-sectional views illustrating a method of fabricating a semiconductor device according to some embodiments.
Figure 25:
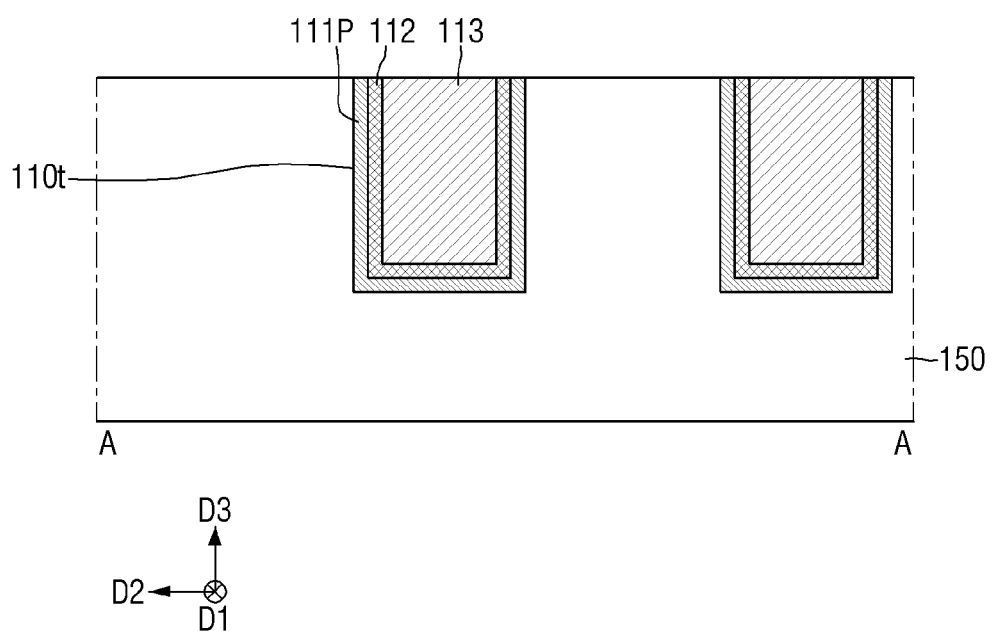
Figure 26:
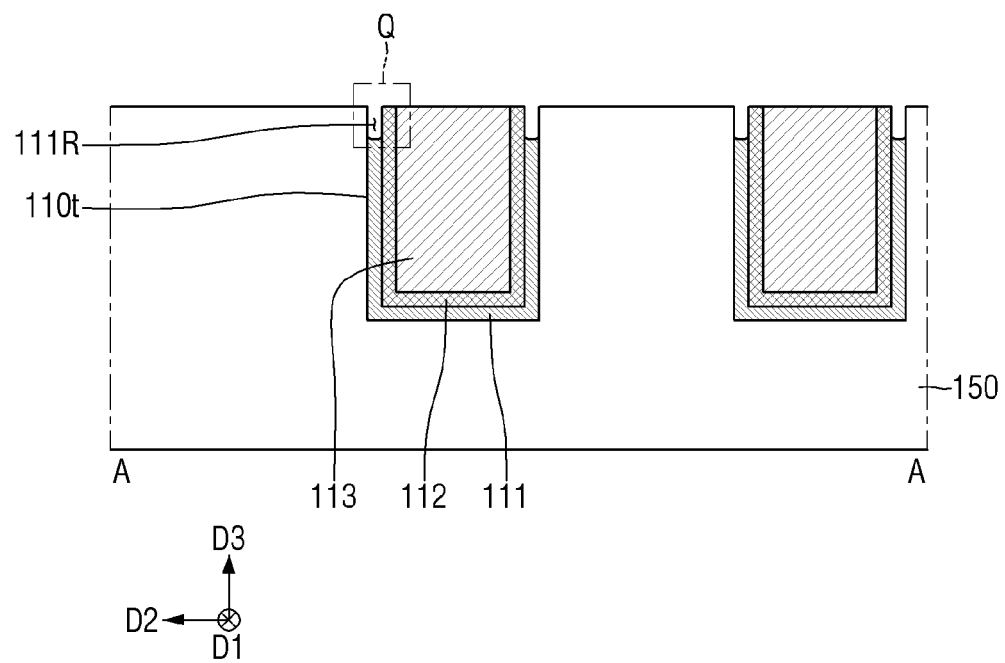
Figure 27:
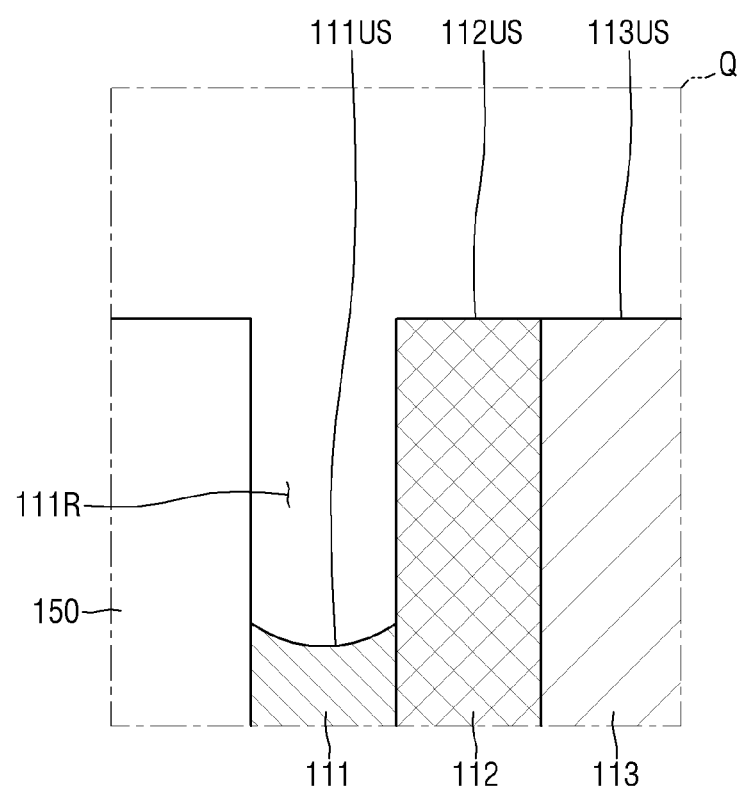

Specifically, FIGS. 24 through 26, 28, and 29 are cross-sectional views taken along line A-A of FIG. 1, and FIG. 27 is an enlarged cross-sectional view of part Q of FIG. 26.

Referring to FIG. 24, a first interlayer insulating film 150 including a lower wiring trench 110*t* may be formed.

The lower wiring trench 110*t* may extend in a first direction D1.

Referring to FIG. 25, a pre-lower barrier film 111P, a second lower barrier film 112, and a lower filling film 113 may be formed in the first interlayer insulating film 150.

The pre-lower barrier film 111P, the second lower barrier film 112, and the lower filling film 113 may be formed in the lower wiring trench 110*t*.

The pre-lower barrier film 111P may extend along the sidewalls and the bottom surface of the lower wiring trench 110*t*. The second lower barrier film 112 may be disposed on the pre-lower barrier film 112. The second lower barrier film 112 may extend along the sidewalls and the bottom surface of the lower wiring trench 110*t*. The lower filling film 113 may be disposed on the second lower barrier film 112. The second lower barrier film 112 may be disposed between the pre-lower barrier film 111P and the lower filling film 113.

Referring to FIGS. 26 and 27, a first lower barrier film 111 may be formed by removing part of the pre-lower barrier film 111P.

The pre-lower barrier film 111P may be removed by an etching process. For example, part of the pre-lower barrier film 111P may be removed by a dry or wet etching process.

As part of the pre-lower barrier film 111P is removed by an etching process, a upper surface 111US of the first lower barrier film 111 may include a concave surface, but embodiments are not limited thereto.

The upper surface 111US of the first lower barrier film 111 may be lower than a upper surface 112US of the second lower barrier film 112 and a upper surface 113US of the lower filling film 113.

As the first lower barrier film 111 is formed, a lower barrier film recess 111R, which is defined by the first interlayer insulating film 150, the second lower barrier film 112, and the first lower barrier film 111, may be formed.

Figure 28:
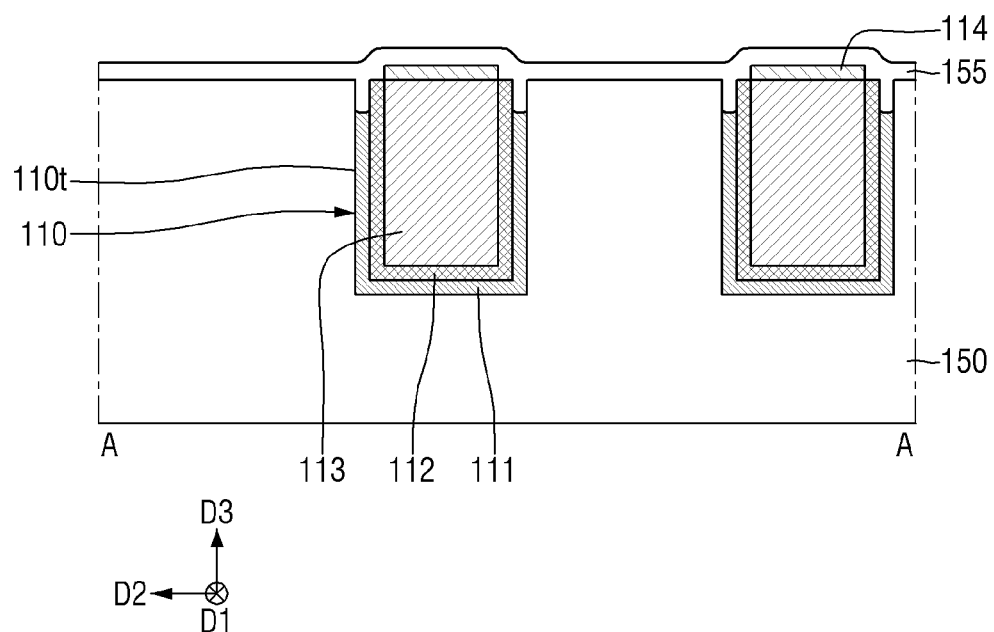

Referring to FIG. 28, a lower capping film 114 may be formed along the upper surface 113US of the lower filling film 113.

As the lower capping film 114 is formed, lower wiring structure 110 may be formed in the lower wiring trench 110*t*.

Thereafter, a first etch stopper film 155 may be formed on the first interlayer insulating film 150 and the lower wiring structure 110. The first etch stopper film 155 may extend along the upper surface of the first interlayer insulating film 150 and the upper surface of the lower wiring structure 110, and into the lower barrier film recess 111R.

Figure 29:
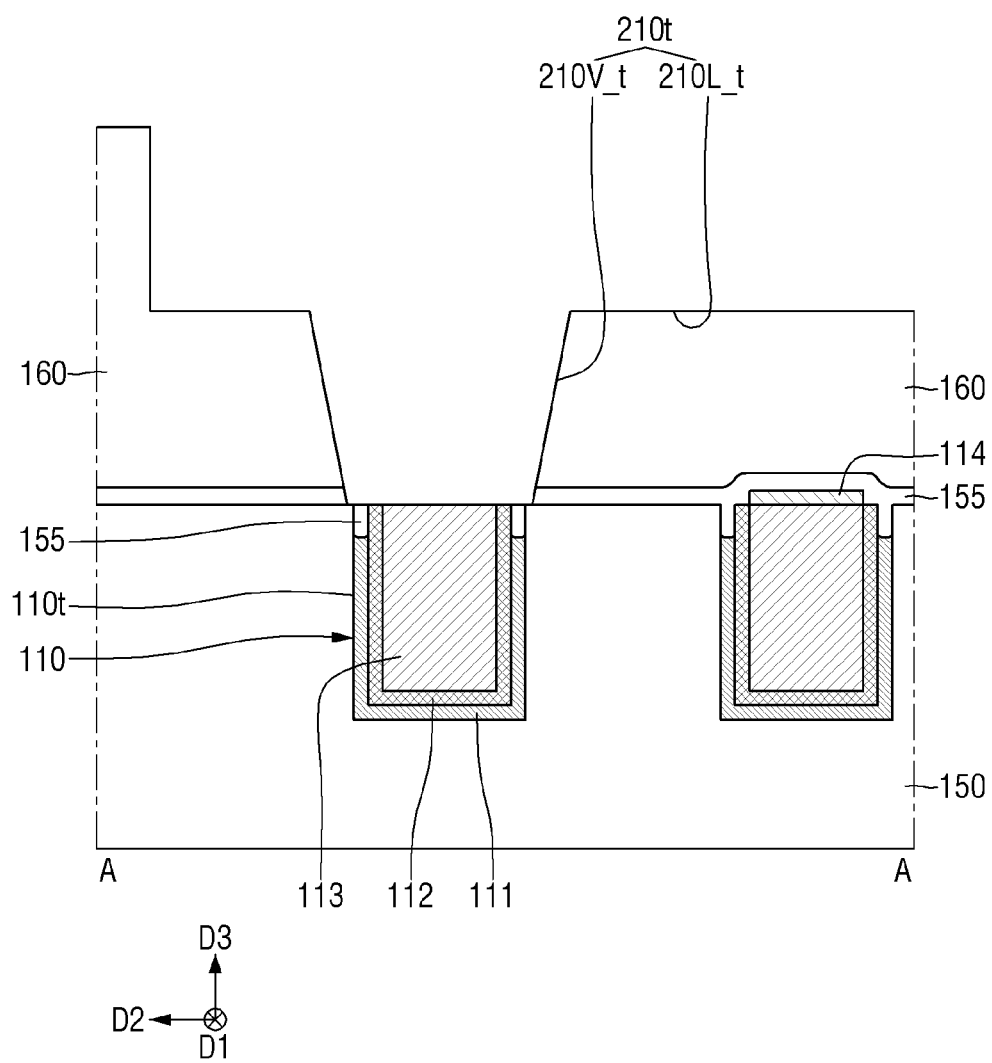

Referring to FIG. 29, a second interlayer insulating film 160 including an upper wiring trench 210*t* may be formed on the first interlayer insulating film 150. Specifically, the second interlayer insulating film 160 may be formed on the first etch stopper film 155.

The upper wiring trench 210*t* may expose at least part of the lower wiring structure 110. The upper wiring trench 210*t* includes an upper via trench 210V_t and an upper wiring line trench 210L_t.

The upper wiring trench 210*t* may penetrate the first etch stopper film 155. The upper wiring trench 210*t* may penetrate the lower capping film 114. Alternatively, the upper wiring trench 210*t* may not penetrate the lower capping film 114.

Thereafter, referring to FIG. 2, an upper wiring structure 210, may be formed in the upper wiring trench 210*t*. The upper wiring structure 210 may be formed in the second interlayer insulating film 160. The upper wiring structure 210 may be connected to the lower wiring structure 110.

While aspects of embodiments have been particularly shown and described, it will be understood that various changes in form and details may be made therein without departing from the spirit and scope of the following claims.

What is claimed is:

1. A semiconductor device comprising:
   a first interlayer insulating film defining a lower wiring trench;
   a lower wiring structure comprising a first lower barrier film which extends along at least two sidewalls of the lower wiring trench, and a lower filling film which is on the first lower barrier film;
   a second interlayer insulating film on the first interlayer insulating film, the second interlayer insulating film defining an upper wiring trench which exposes at least part of the lower wiring structure; and
   an upper wiring structure provided in the upper wiring trench and connected to the lower wiring structure,
   wherein an upper surface of the first lower barrier film is closer to a bottom surface of the lower wiring trench than each of an upper surface of the first interlayer insulating film and an upper surface of the lower filling film,
   wherein the upper surface of the first lower barrier film is concave,
   wherein the lower wiring structure further comprises a second lower barrier film, which is between the first lower barrier film and the lower filling film, and extends along the at least two sidewalls of the lower wiring trench, and
   wherein the upper surface of the first lower barrier film is closer to the bottom surface of the lower wiring trench than an upper surface of the second lower barrier film.

2. The semiconductor device of claim 1, further comprising an etch stopper film extending along the upper surface of the first interlayer insulating film, between the first interlayer insulating film and the second interlayer insulating film,
   wherein the etch stopper film extends into a barrier film recess defined between the first interlayer insulating film and the lower filling film, and
   wherein a bottom surface of the barrier film recess is defined by the upper surface of the first lower barrier film.

3. The semiconductor device of claim 2, wherein the etch stopper film fills the barrier film recess.

4. The semiconductor device of claim 2, further comprising an air gap between the first interlayer insulating film and the lower filling film.

5. The semiconductor device of claim 4, wherein the air gap is surrounded by the etch stopper film.

6. The semiconductor device of claim 1, wherein the upper surface of the second lower barrier film is coplanar with the upper surface of the lower filling film.

7. The semiconductor device of claim 1, wherein the upper surface of the lower filling film is convex.

8. The semiconductor device of claim 1, wherein the first lower barrier film comprises any one or any combination of ruthenium (Ru), molybdenum (Mo), and titanium (Ti), and wherein the second lower barrier film comprises any one or any combination of tantalum (Ta), tantalum nitride (TaN), and cobalt (Co).

9. The semiconductor device of claim 1, wherein the upper wiring structure comprises an upper barrier film which extends along sidewalls and a bottom surface of the upper wiring trench, and an upper filling film which is on the upper barrier film,
wherein the upper barrier film extends into a barrier film recess defined between the first interlayer insulating film and the lower filling film, and
wherein a bottom surface of the barrier film recess is the upper surface of the first lower barrier film.

10. A semiconductor device comprising:
a first interlayer insulating film defining a lower wiring trench;
a lower wiring structure comprising a first lower barrier film which extends along sidewalls of the lower wiring trench, a lower filling film which is on the first lower barrier film, a second lower barrier film which is between the first lower barrier film and the lower filling film and extends along the sidewalls of the lower wiring trench, and a lower capping film which extends along an upper surface of the lower filling film and comprises side surfaces which face the second lower barrier film;
a second interlayer insulating film on the first interlayer insulating film, the second interlayer insulating film defining an upper wiring trench which exposes at least part of the lower wiring structure;
an etch stopper film extending along an upper surface of the first interlayer insulating film, between the first interlayer insulating film and the second interlayer insulating film; and
an upper wiring structure comprising an upper barrier film which extends along sidewalls of the upper wiring trench, and an upper filling film which is on the upper barrier film,
wherein an upper surface of the first lower barrier film is closer to a bottom surface of the lower wiring trench than each of the upper surface of the second lower barrier film and the upper surface of the lower filling film.

11. The semiconductor device of claim 10, wherein the upper surface of the first lower barrier film is concave.

12. The semiconductor device of claim 10, wherein the etch stopper film extends into a barrier film recess defined between the first interlayer insulating film and the second lower barrier film, and
wherein a bottom surface of the barrier film recess is defined by the upper surface of the first lower barrier film.

13. The semiconductor device of claim 10, wherein the upper barrier film extends into a barrier film recess defined between the first interlayer insulating film and the lower filling film, and
wherein a bottom surface of the barrier film recess is defined by the upper surface of the first lower barrier film.

14. The semiconductor device of claim 10, further comprising an air gap between the first interlayer insulating film and the second lower barrier film, and between a bottom surface of the upper wiring structure and the upper surface of the first lower barrier film.

15. The semiconductor device of claim 10, wherein the upper surface of the second lower barrier film is coplanar with the upper surface of the lower filling film.

16. The semiconductor device of claim 10, wherein the upper surface of the lower filling film is convex.

17. The semiconductor device of claim 10, wherein the upper wiring structure is in contact with the upper surface of the lower filling film.

18. A semiconductor device comprising:
a first interlayer insulating film defining a lower wiring trench;
a lower wiring structure comprising a first lower barrier film which extends along sidewalls of the lower wiring trench, a lower filling film which is on the first lower barrier film, and a second lower barrier film which is between the first lower barrier film and the lower filling film and extends along the sidewalls of the lower wiring trench;
a second interlayer insulating film on the first interlayer insulating film, the second interlayer insulating film defining an upper wiring trench which exposes at least part of the lower wiring structure;
an etch stopper film extending between the first interlayer insulating film and the second interlayer insulating film; and
an upper wiring structure comprising an upper barrier film which extends along sidewalls of the upper wiring trench, and an upper filling film which is on the upper barrier film,
wherein an upper surface of the first lower barrier film is closer to a bottom surface of the lower wiring trench than each of an upper surface of the second lower barrier film and an upper surface of the lower filling film,
wherein the first lower barrier film comprises any one or any combination of ruthenium (Ru), molybdenum (Mo), and titanium (Ti),
wherein the second lower barrier film comprises any one or any combination of tantalum (Ta), tantalum nitride (TaN), and cobalt (Co), and
wherein the lower filling film comprises copper (Cu).

19. The semiconductor device of claim 18, wherein the etch stopper film extends into a barrier film recess defined between the first interlayer insulating film and the second lower barrier film, and
wherein a bottom surface of the barrier film recess is defined by the upper surface of the first lower barrier film.

* * * * *